United States Patent [19]

Mori

[11] Patent Number: 5,372,963

[45] Date of Patent: Dec. 13, 1994

[54] METHOD FOR MANUFACTURING A SEMICONDUCTOR MEMORY DEVICE CAPABLE OF PREVENTING MEMORY CELLS FROM DETERIORATING IN ELECTRIC CHARACTERISTICS

[75] Inventor: Seiichi Mori, Tokyo, Japan

[73] Assignee: Kabushiki Kaisha Toshiba, Kawasaki, Japan

[21] Appl. No.: 36,691

[22] Filed: Mar. 25, 1993

[30] Foreign Application Priority Data

Apr. 23, 1992 [JP] Japan .................................. 4-104409

[51] Int. Cl.$^5$ ........................................... H01L 21/265
[52] U.S. Cl. ........................................ 437/48; 437/50; 437/43
[58] Field of Search .................... 437/52, 43, 48, 50, 437/47, 29; 257/390, 391

[56] References Cited

U.S. PATENT DOCUMENTS

| | | |
|---|---|---|
| 4,500,899 | 2/1985 | Shirai et al. . |
| 4,994,407 | 2/1991 | Custode et al. ........................ 437/70 |
| 5,004,701 | 4/1991 | Motokawa ............................ 437/47 |

FOREIGN PATENT DOCUMENTS 1-20886  8/1989  Japan .

OTHER PUBLICATIONS

Yoichi Ohshima et al., IEDM Technical Digest, Dec. 9, 1990, pp. 95–98, "Process and Device Technologies for 16Mbit EPROM with Large-Tilt-Angle Implanted P-Pocket Cell".

Primary Examiner—Olik Chaudhuri
Assistant Examiner—H. Jey Tsai
Attorney, Agent, or Firm—Banner, Birch, McKie and Beckett

[57] ABSTRACT

A method for manufacturing a semiconductor memory device according to the present invention, comprises the steps of forming a plurality of striped element separating regions in a surface region of a semiconductor substrate to obtain a plurality of striped element forming regions on the semiconductor substrate, forming at least first, second, and third word lines so as to cross the element forming regions at right angles, delimiting a drain forming region formed between the first and second word lines and surrounded by the element separating regions, and delimiting a source forming region between the second and third word lines, forming a first cover on a region between the first and second word lines, removing the element separating regions from the source forming region, using the first cover and the first, second and third word lines as masks, forming a second cover at least on the source forming region, and introducing impurities whose conductivity type is equal to a conductivity type of the semiconductor substrate, into the semiconductor substrate, using the second cover as a mask.

20 Claims, 18 Drawing Sheets

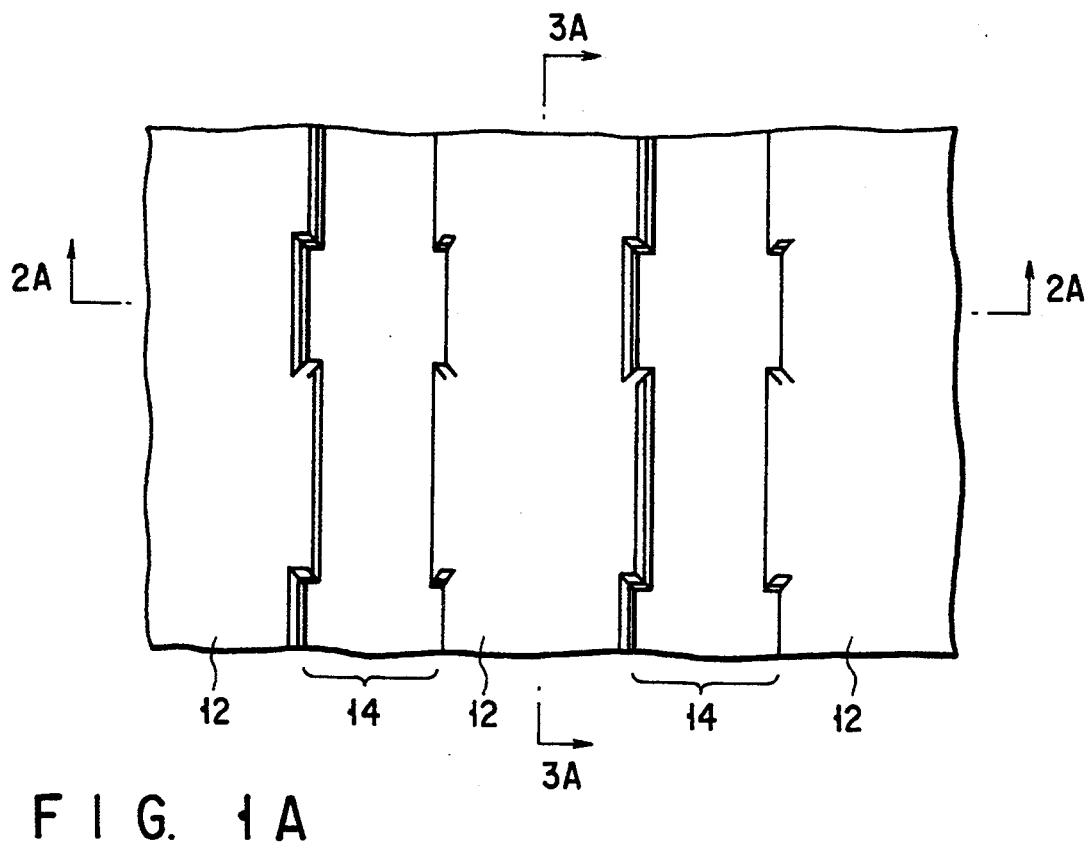
F I G. 1A
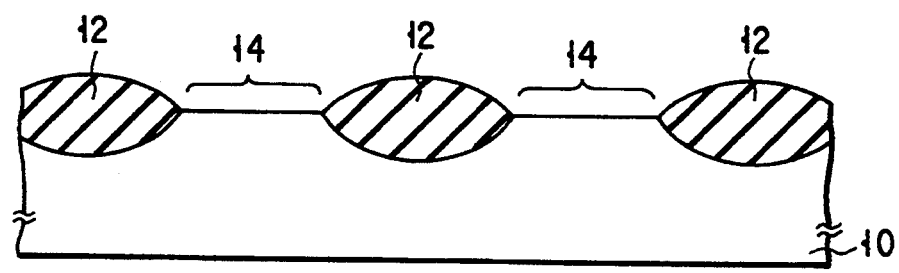
F I G. 2A
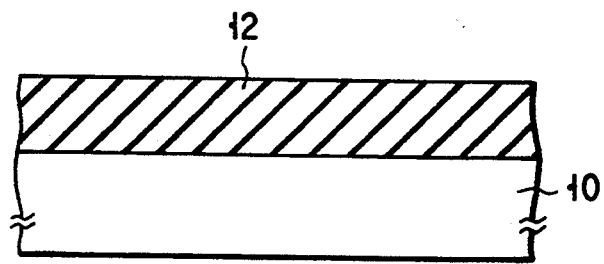
F I G. 3A

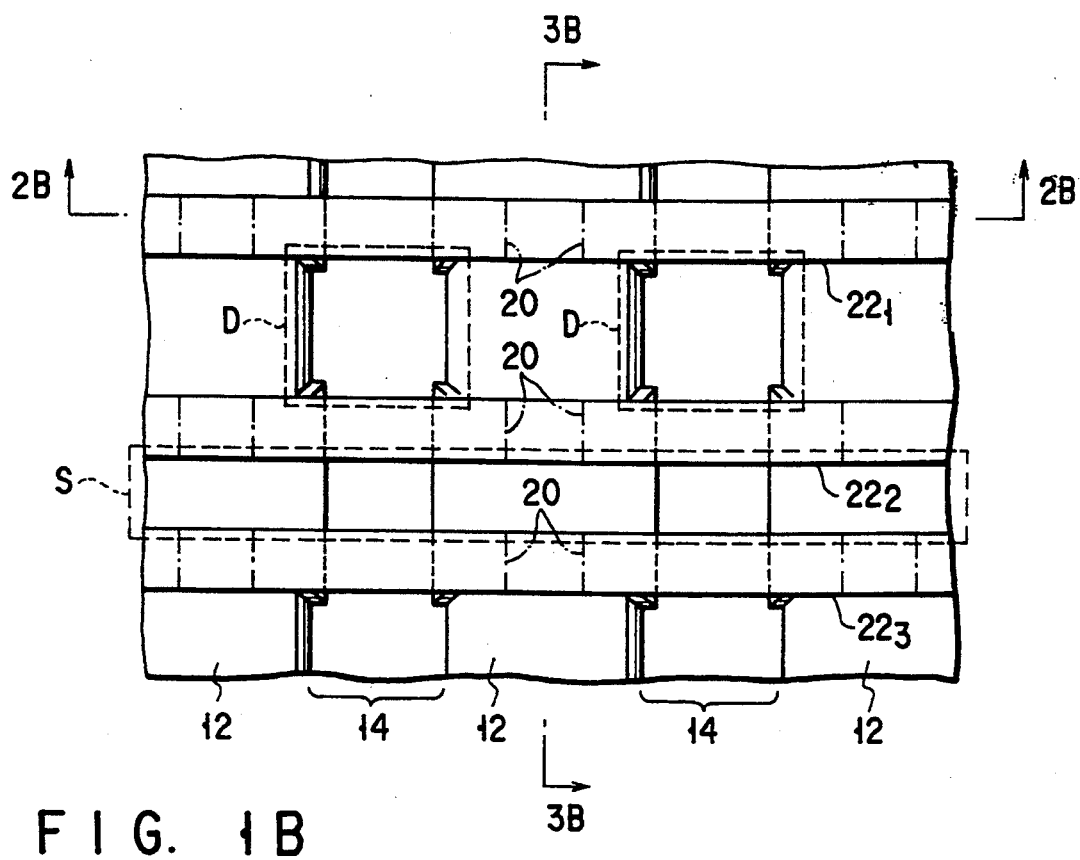
F I G. 1B
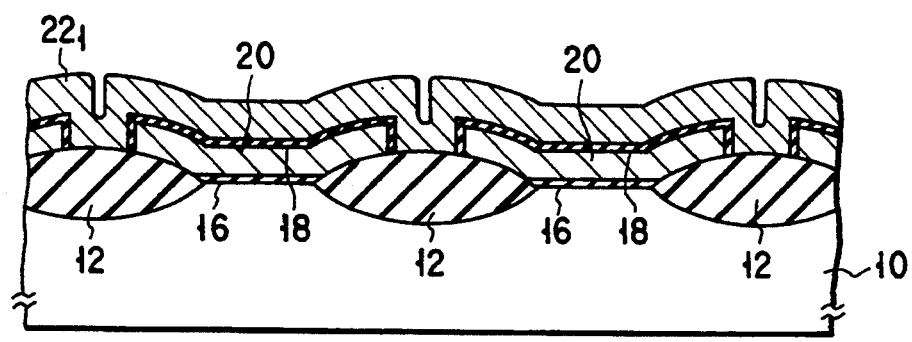
F I G. 2B
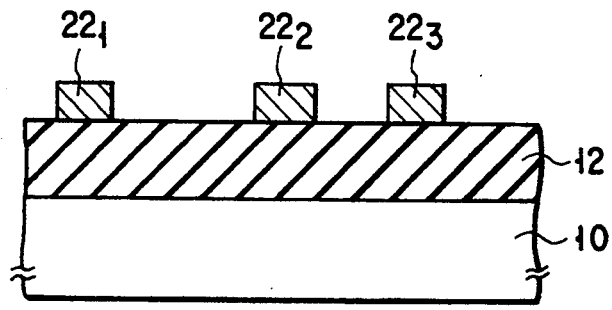
F I G. 3B

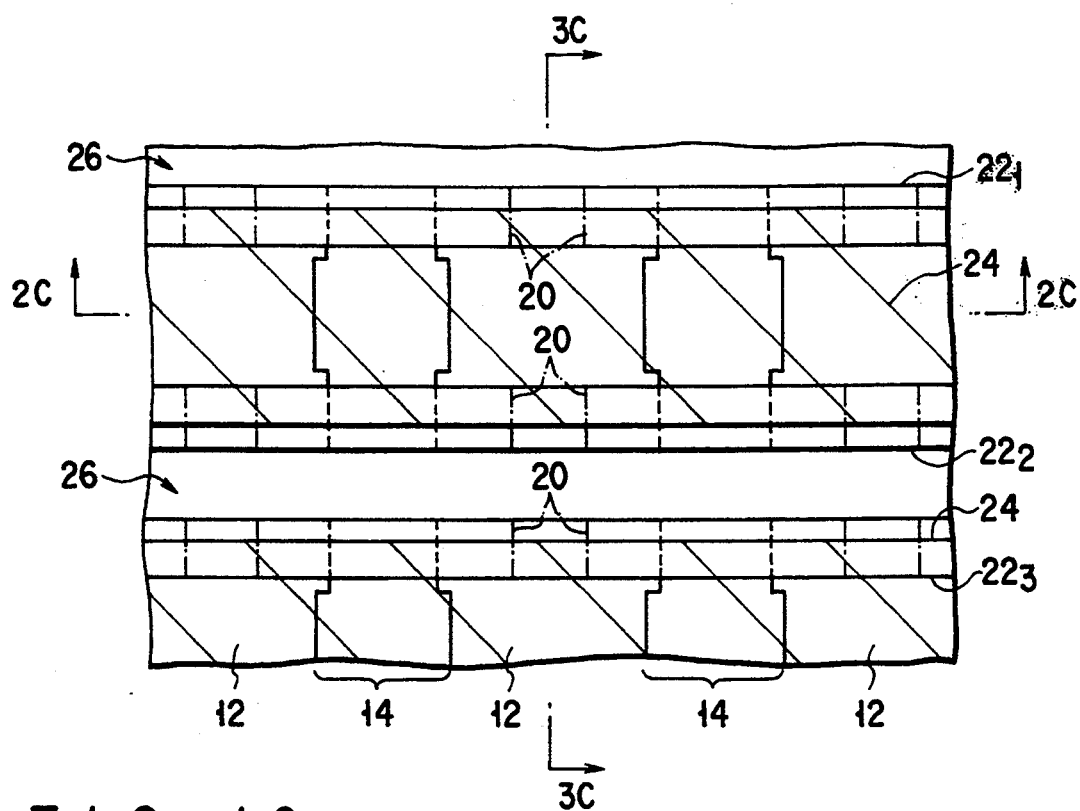
F I G. 1C
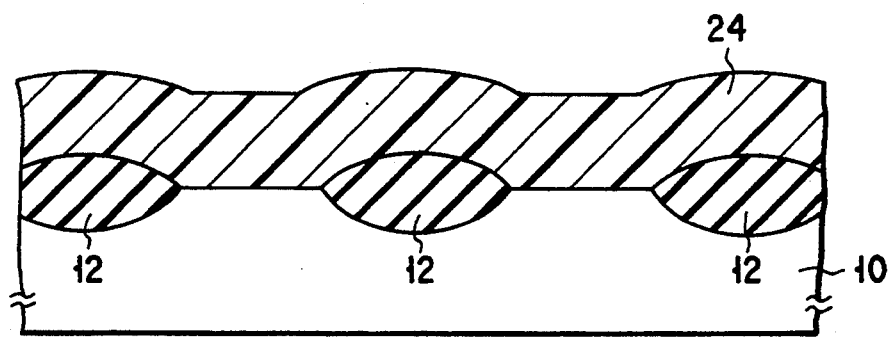
F I G. 2C
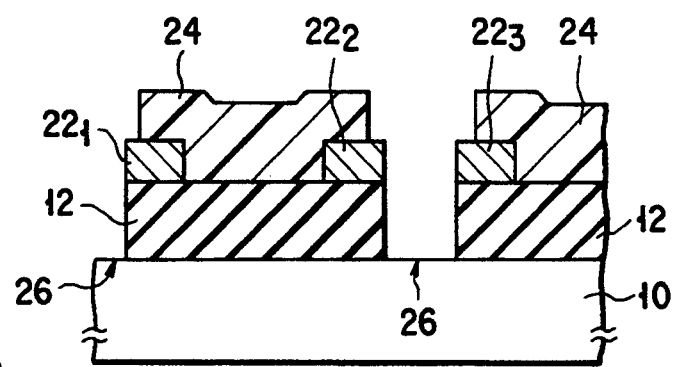
F I G. 3C

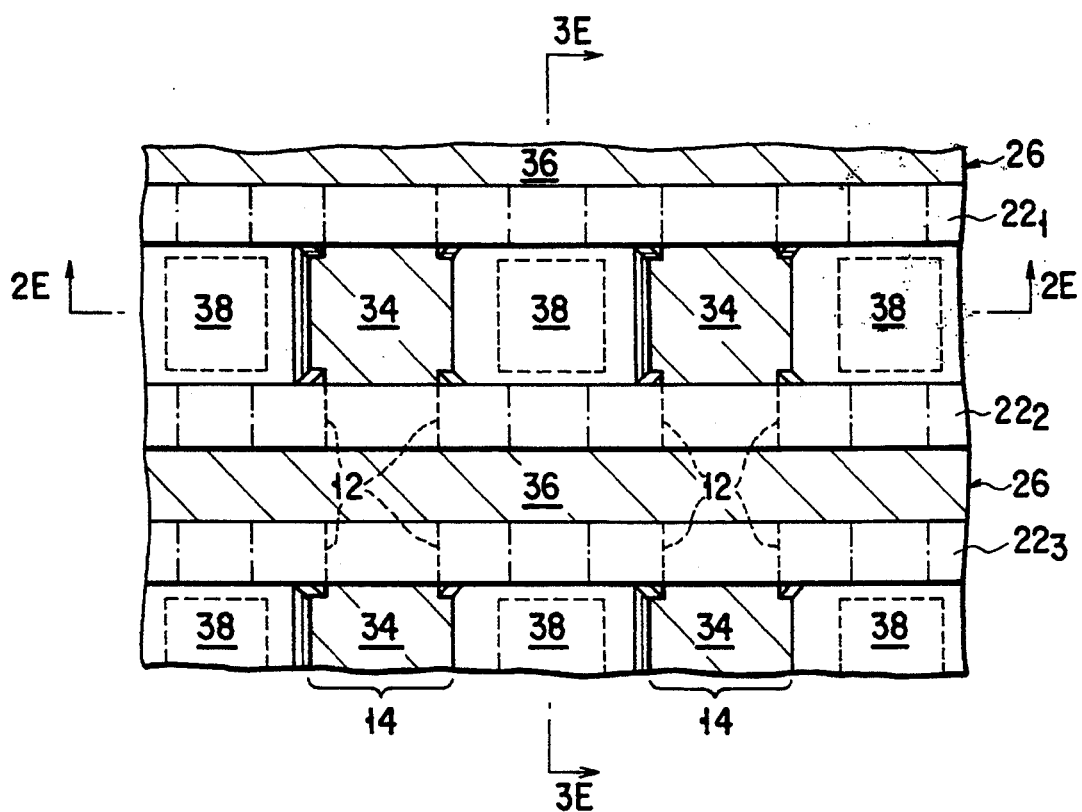
F I G. 1E
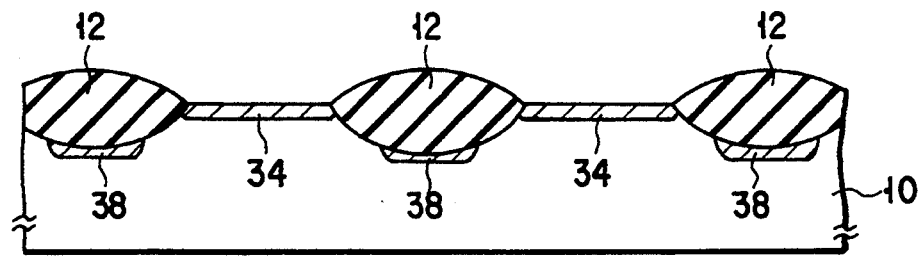
F I G. 2E
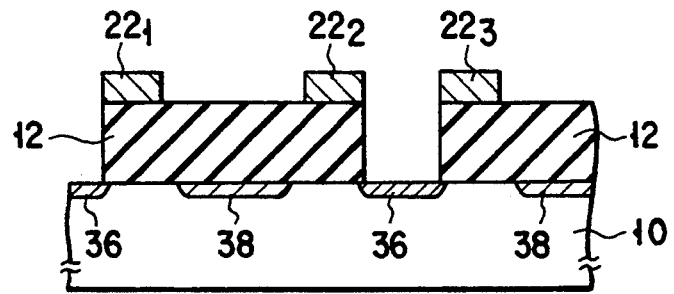
F I G. 3E

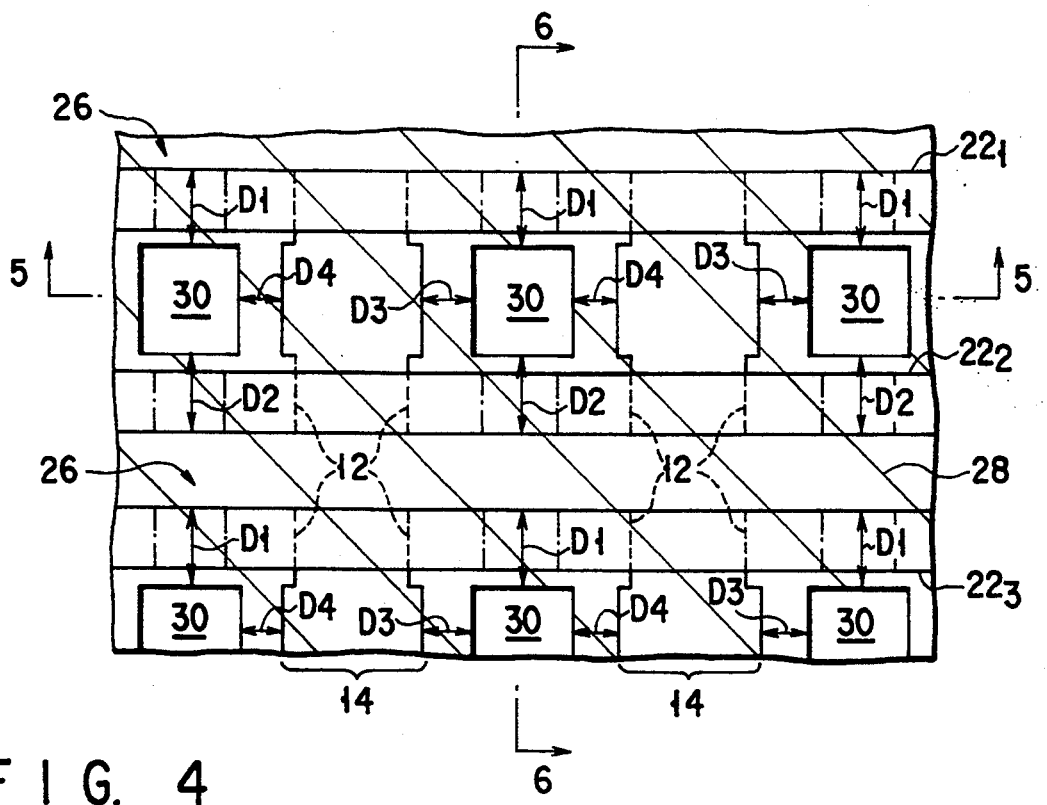
F I G. 4
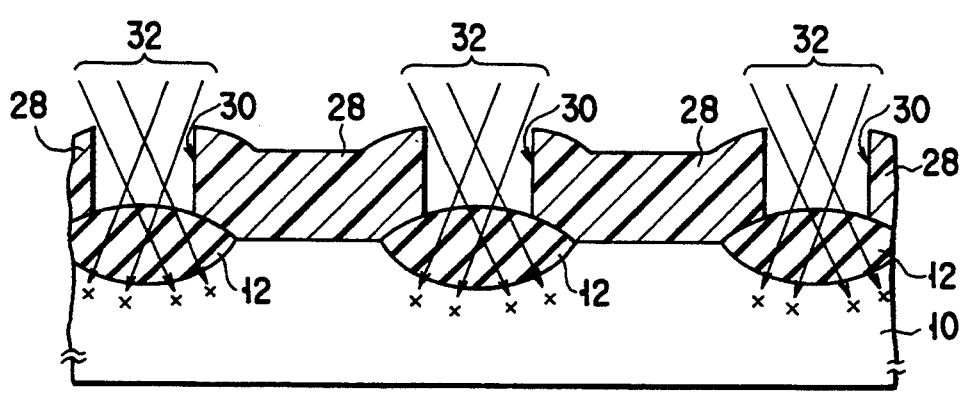
F I G. 5
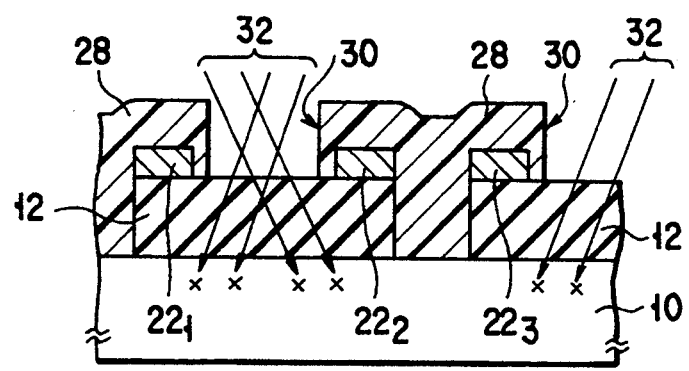
F I G. 6

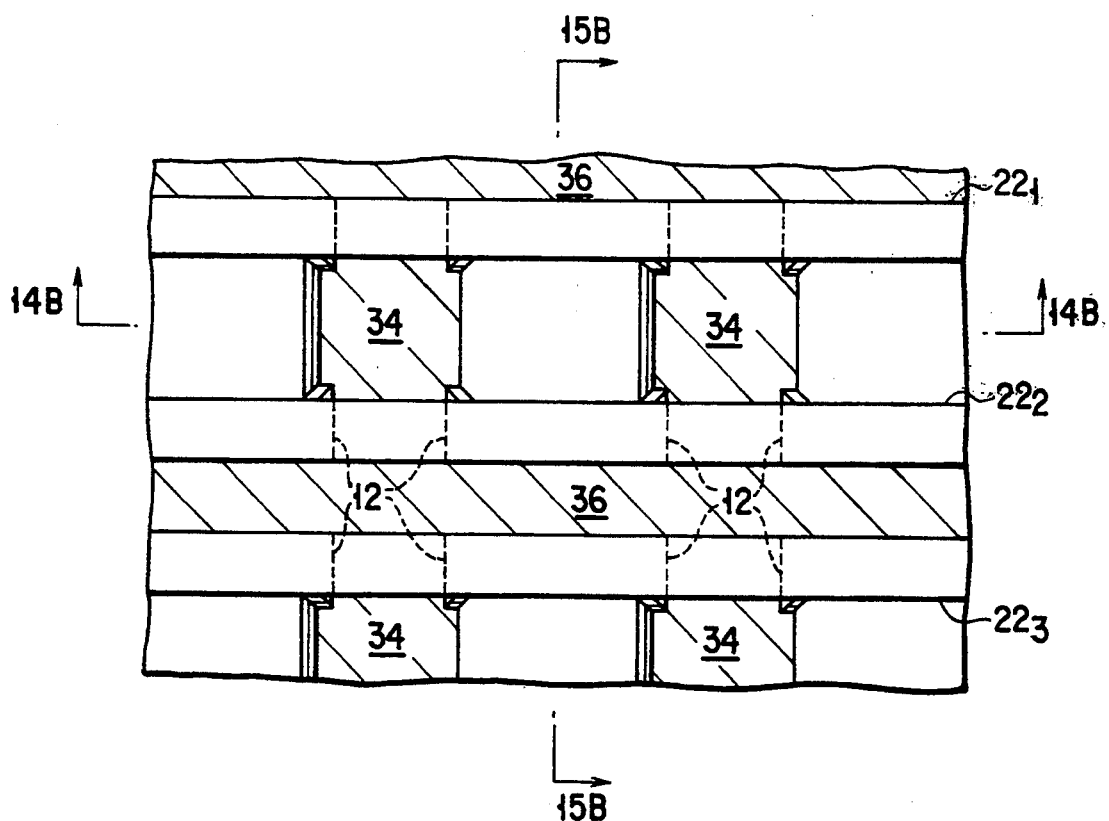
F I G. 13B
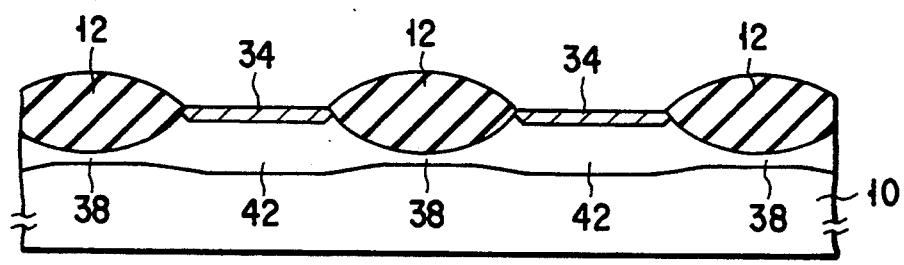
F I G. 14B
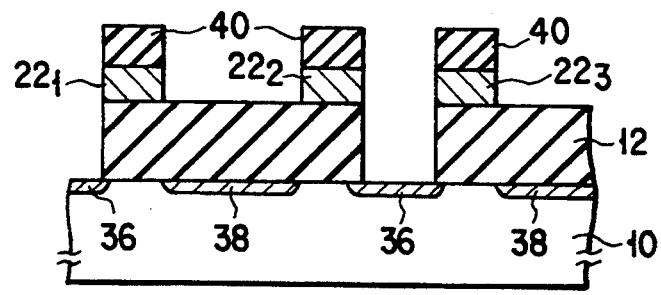
F I G. 15B

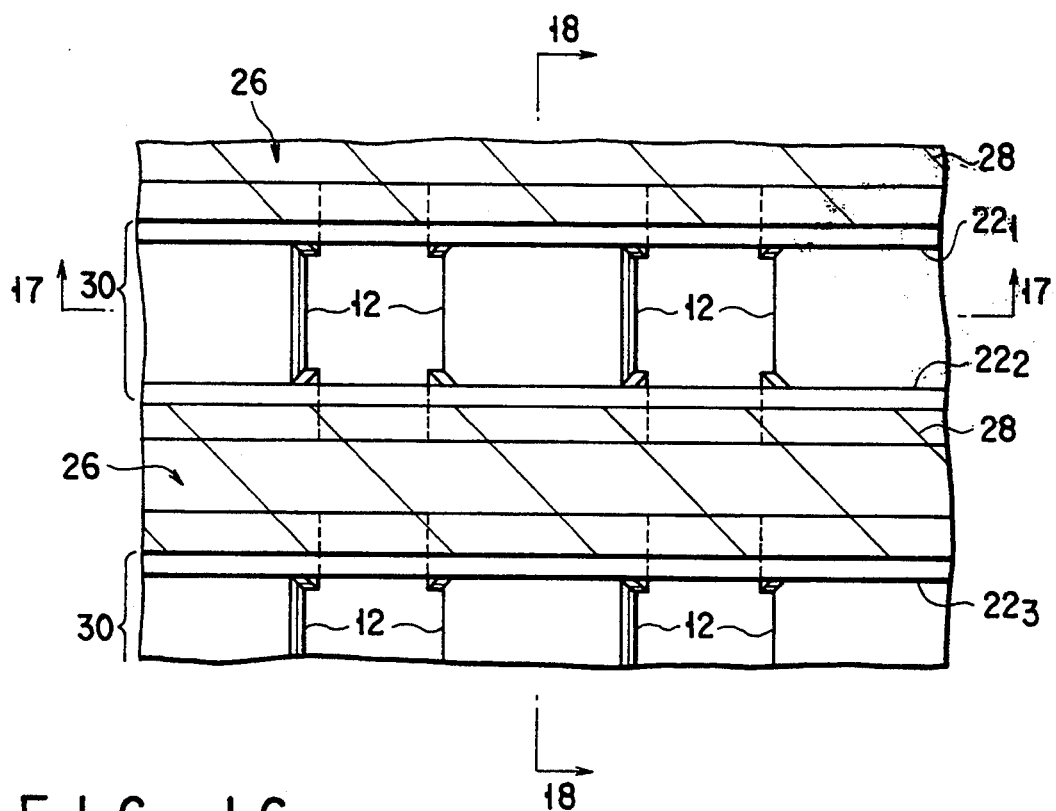
F I G. 16
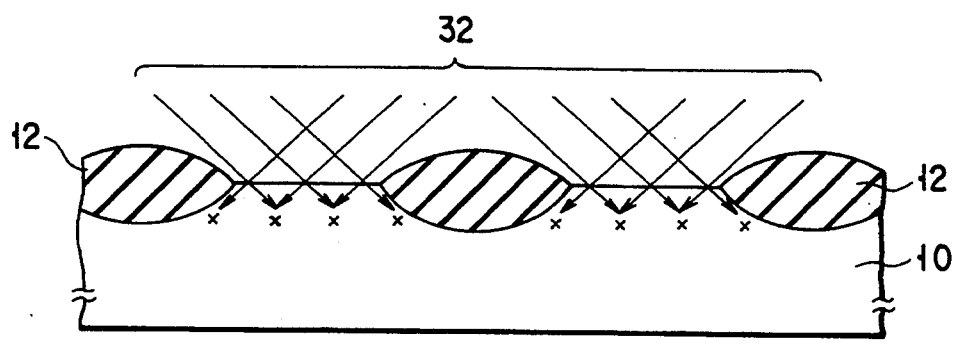
F I G. 17
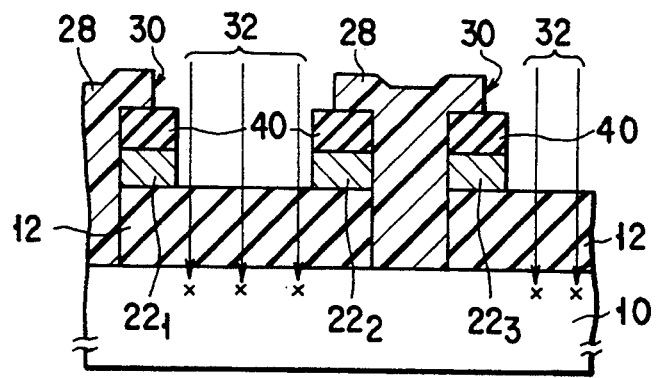
F I G. 18

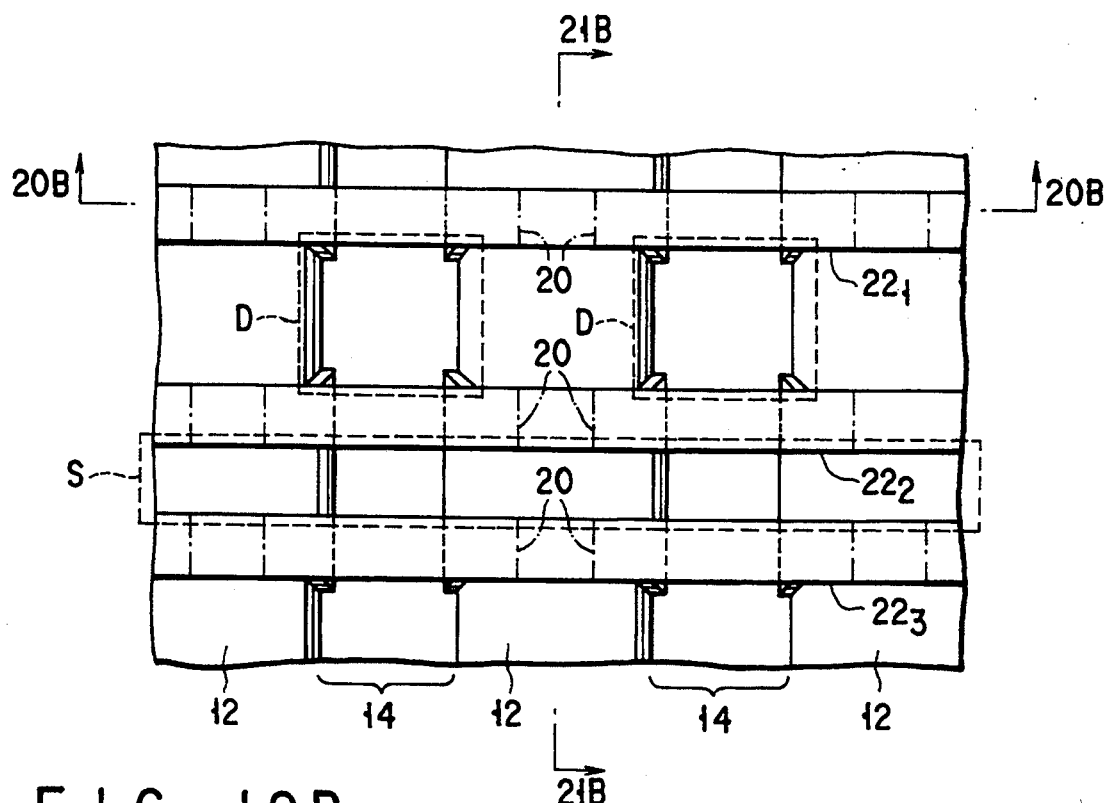
F I G. 19B
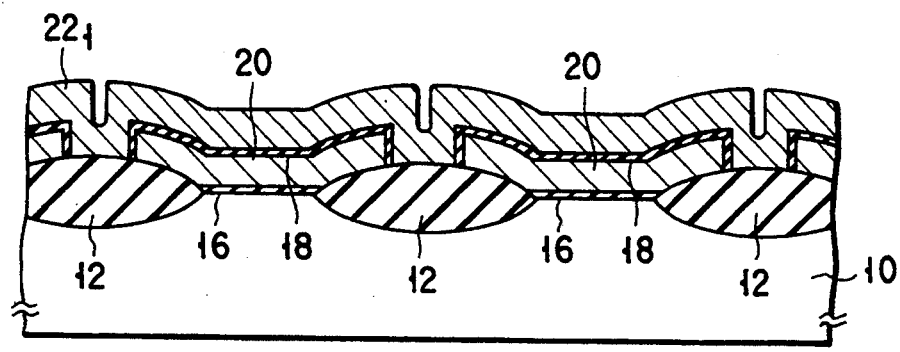
F I G. 20B
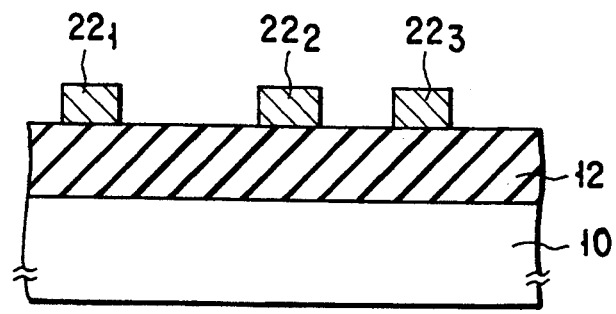
F I G. 21B

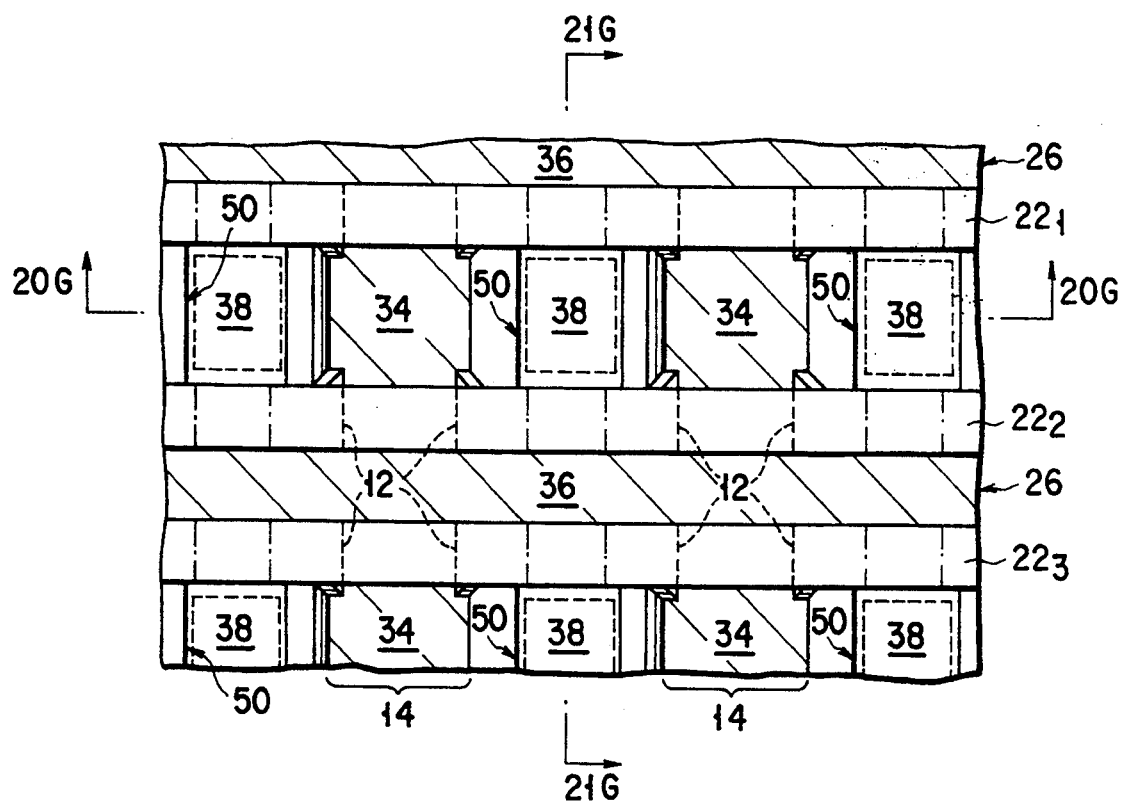
F I G. 19G
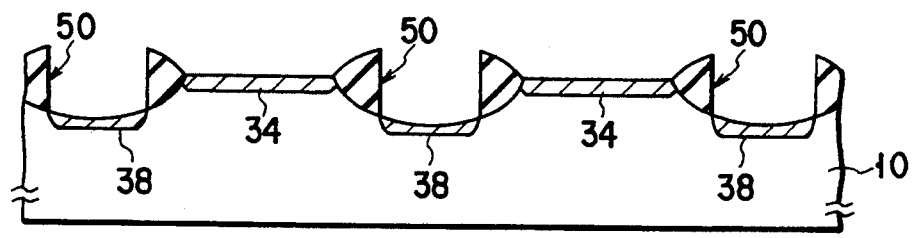
F I G. 20G
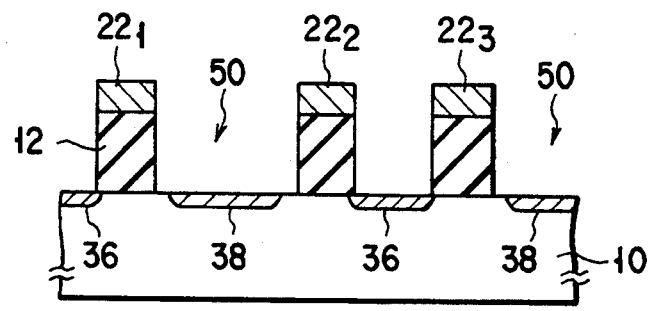
F I G. 21G

METHOD FOR MANUFACTURING A SEMICONDUCTOR MEMORY DEVICE CAPABLE OF PREVENTING MEMORY CELLS FROM DETERIORATING IN ELECTRIC CHARACTERISTICS

BACKGROUND OF THE INVENTION

1. Field of the Invention

The present invention relates to a method for manufacturing a semiconductor memory device and, more specifically, to a method for manufacturing a semiconductor memory device which is improved in field ion implantation.

2. Description of the Related Art

According to a conventional method for manufacturing a commonly-used nonvolatile semiconductor memory device, a field oxide film is formed on a substrate and separated into element forming regions such as a source region, and word lines and the like are formed on the substrate. This method, however, requires a space for matching, for example, the source region and word lines with each other, which is a hindrance to miniaturization of memory cells.

To resolve this problem, a method for manufacturing a semiconductor memory device is proposed in which a field oxide film is etched using a word line as a mask to expose the surface of a substrate and thus form a source region. Hereinafter, this method is called an SAS (Self Aligned Source) process wherein the source region is self-aligned with the word line. This method is disclosed in Y. Oshima et al., "Process and Device Technologies for 16 Mbit EPROMs with Large-Tilt-Angle Implanted P-pocket Cell," *IEDM Technical Digest*, Dec. 9, 1990, pp. 95–98.

The SAS process has the advantage of requiring no spaces for matching a source region and a word line with each other and offers easy miniaturizing of memory cells. Since, however, a source line forming region is formed by etching a field oxide film, a channel stopper diffusion layer and a source diffusion layer contact with each other. The channel stopper diffusion layer is formed under the field oxide film. Both the diffusion layers have a high impurity concentration. In particular, since the channel stopper diffusion layer is of the same conductivity type as that of the substrate, if it contacts the source diffusion layer, a withstanding voltage between the source diffusion layer and the substrate is dropped.

The drop in the withstanding voltage is a great drawback to a flash EEPROM in which electrons are extracted from a floating gate by applying a high voltage to the source diffusion layer. The impurity concentration of the channel stopper region has to increase in accordance with the miniaturization of the memory cells. Since, however, a tunnel oxide film of the memory cell cannot be easily scaled, the voltage applied to the source diffusion layer is not decreased too much.

Conventionally, the channel stopper diffusion layer is formed entirely under the field oxide film. Therefore, impurities included in the channel stopper diffusion layer are diffused into a channel region to increase the threshold voltage of a transistor, that is, to induce a so-called "narrow channel effect."

SUMMARY OF THE INVENTION

A first object of the present invention is to provide a method for manufacturing a semiconductor memory device wherein a source diffusion layer is self-aligned with word lines, and the source diffusion layer is not brought into contact with a diffusion layer for improving the insulation properties of the surface of a substrate under a field insulating film, thereby increasing a withstanding voltage of the device.

A second object of the present invention is to provide a method for manufacturing a semiconductor memory device capable of increasing a withstanding voltage, and preventing impurities for forming a diffusion layer for improving the insulation properties from diffusing into channel regions of memory cell transistors to improve the reliability of the memory cell transistors.

A third object of the present invention is to provide a method for manufacturing a semiconductor memory device capable of introducing impurities into a desired portion under a field insulating film even if a displacement in mask occurs in a step of inducing impurities to form a diffusion layer for improving the insulation properties of a substrate under the field insulating oxide film.

A fourth object of the present invention is to provide a method for manufacturing a semiconductor memory device capable of introducing, at low energy, impurities for forming a diffusion layer for improving the insulation properties.

A fifth object of the present invention is to provide a method for manufacturing a semiconductor memory device capable of reducing an adverse influence of impurities for forming a diffusion layer for improving the insulation properties under a field insulation film, and preventing the characteristics of the memory cells from deteriorating.

To obtain the above objects, there is provided a method for manufacturing a semiconductor memory device comprising the steps of:

forming a plurality of element separating regions in a surface region of a semiconductor substrate to obtain a plurality of element forming regions on the semiconductor substrate;

forming at least first, second, and third word lines so as to cross the element forming regions at right angles, delimiting a drain forming region formed between the first and second word lines and surrounded by the element separating regions, and delimiting a source forming region between the second and third word lines;

forming a first cover on a region between the first and second word lines;

removing the element separating regions from the source forming region, using the first cover and the first, second and third word lines as masks;

forming a second cover at least on the source forming region; and introducing impurities whose conductivity type is equal to a conductivity type of the semiconductors substrate, into the semiconductor substrate, using the second cover as a mask.

In the present invention, when the impurities having the same conductivity type as that of the semiconductor substrate are introduced into the substrate, if at least the source forming region is masked, a diffusion layer and a source diffusion layer for increasing the insulation properties of the surface of the substrate under the element separating regions, do not contact each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1E are plan views showing steps in a method for manufacturing a semiconductor memory device according to a first embodiment of the present invention;

FIGS. 2A to 2E are cross-sectional views taken along lines 2A—2A to 2E—2E of FIGS. 1A to 1E;

FIGS. 3A to 3E are cross-sectional views taken along lines 3A—3A to 3E—3E of FIGS. 1A to 1E;

FIG. 4 is a plan view showing the main step of a first modification to the manufacturing method according to the first embodiment of the present invention;

FIG. 5 is a cross-sectional view taken along line 5—5 of FIG. 4;

FIG. 6 is a cross-sectional view taken along line 6—6 of FIG. 4;

FIGS. 13A and 13B are plan views showing the main steps in a method for manufacturing a semiconductor memory device according to a third embodiment of the present invention;

FIGS. 14A and 14B are cross-sectional views taken along line 14A—14A and line 14B—14B of FIGS. 13A and 13B, respectively;

FIGS. 15A and 15B are cross-sectional views taken along line 15A—15A and line 15B—15B of FIGS. 13A and 13B, respectively;

FIG. 16 is a plan view showing the main step of a modification to the third embodiment of the present invention;

FIG. 17 is a cross-sectional view taken along line 17—17 of FIG. 16;

FIG. 18 is a cross-sectional view taken along 18—18 of FIG. 16;

FIGS. 19A to 19G are plan views showing the steps in the manufacturing method according to the second embodiment of the present invention;

FIGS. 20A to 20G are cross-sectional views taken along lines 20A—20A to 20G—20G of FIGS. 19A to 19G, respectively; and FIGS. 21A to 21G are cross-sectional views taken along lines 21A—21A to 21G—21G of FIGS. 19A to 19G.

DETAILED DESCRIPTION OF THE PREFERRED EMBODIMENTS

Figure 1D:
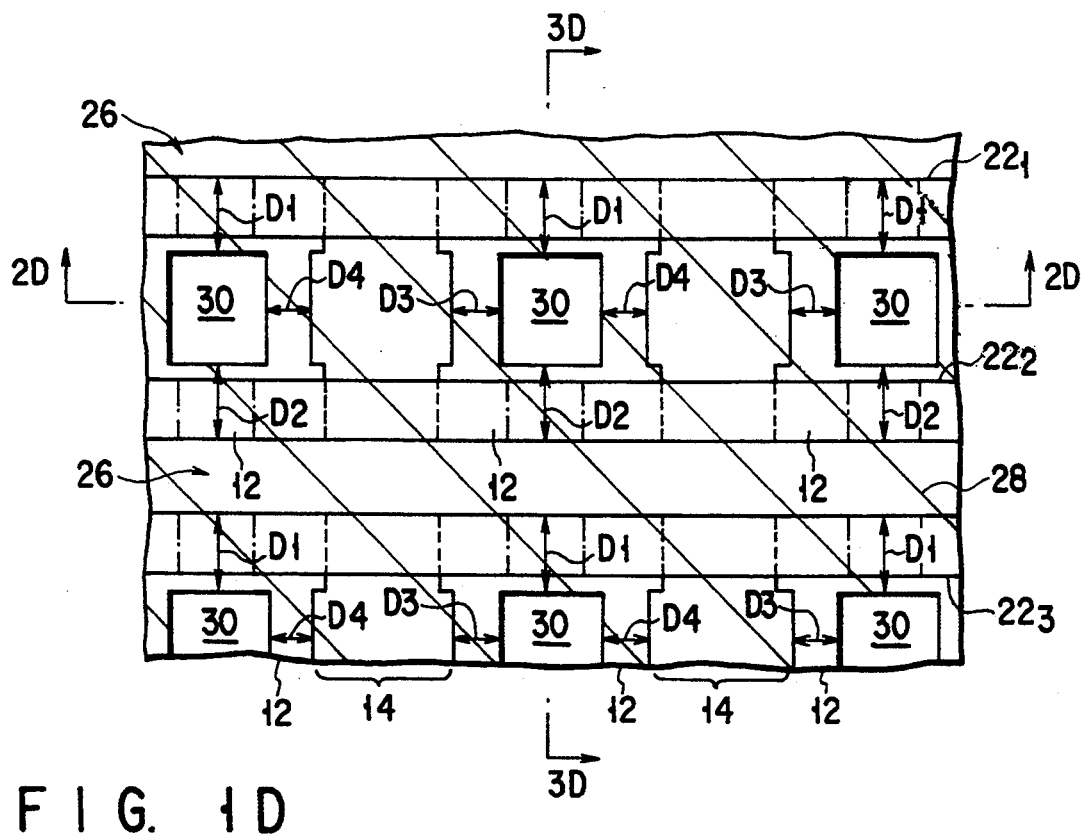
Figure 2D:
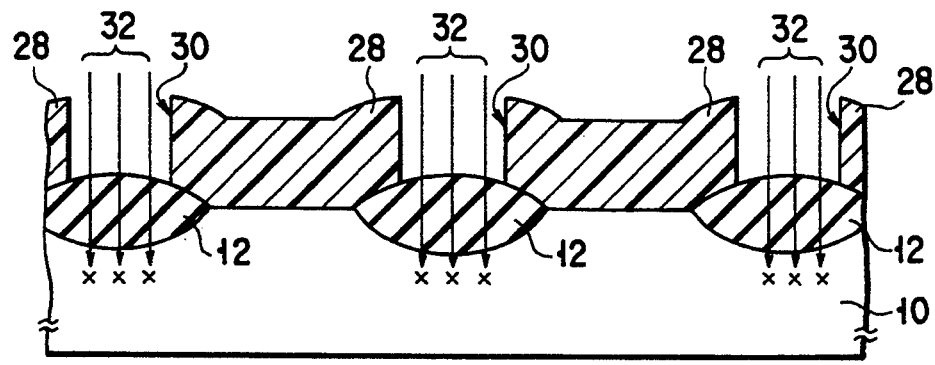
Figure 3D:
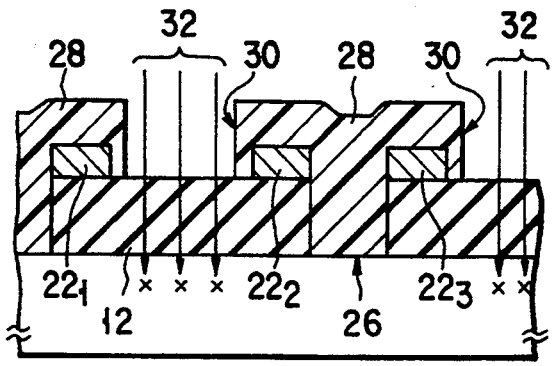

Embodiments of the present invention will new be described, with reference to the accompanying drawings. The same reference numerals are used for the same structural elements in different embodiments in order to avoid redundant descriptions of the elements.

FIGS. 1A to 1E are plan views showing steps in a method for manufacturing a semiconductor memory device according to a first embodiment of the present invention. FIGS. 2A to 2E are cross-sectional views taken along lines 2E—2E of FIGS. 1A to 1E, respectively, and FIGS. 3A to 3E are cross-sectional views taken along lines 3A—3A to 3E—3E of FIGS. 1A to 1E, respectively.

As shown in FIGS. 1A to 3A, field oxide films 12 are formed on selected portions of a P-type silicon substrate 10 by using LOCOS (Local Oxidation of Silicon). The field oxide films are arranged substantially in a striped fashion and in parallel with a direction in which bit lines are to be formed. Element forming regions 14 are thus formed substantially in a striped fashion on the substrate. The surface of the substrate 10 is exposed to the element forming regions 14.

In the step of forming the field oxide films shown in FIGS. 1A to 3A, basically, P-type impurities for forming a channel stopper need not be ion-implanted (field ion implantation need not be performed). In this step, however, the field ion implantation can be period formed in view of a device to be manufactured. In this case, it is important that the impurity concentration of a channel stopper formed under the field oxide films 12 be made lower than that of a generally-used channel stopper, because a breakdown voltage has to be prevented from decreasing due to contact of the channel stopper with a diffusion layer.

For example, the generally-used channel stopper is formed by implanting ions whose dose is about $5 \times 10^{13}$ $cm^{-2}$.

In the first embodiment, when ions are implanted into surface regions of the substrate where the field oxide films 12 are formed, in order to improve the conduction blocking effect of a parasitic transistor whose word lines are used as a gate, their dose is set to about $5 \times 10^{12}$ $cm^{-2}$. This amount of dose is able to sufficiently improve the conduction blocking effect of the parasitic transistor.

As shown in FIGS. 1B to 3B, the surface of the substrate 10 exposed to the element forming regions 14 is thermally oxidized. Thus, gate oxide films (SiO$_2$) 16 each having such a thickness as to obtain a tunnel effect, are formed. Then, a first level polysilicon film, which is to constitute a floating gate, is formed over the substrate 10. A slit is formed in the first level polysilicon film to separate the floating gate formed in a direction of the word lines. Next, the surface of the first level polysilicon film is thermally oxidized or a silicon oxide film is deposited over the substrate 10 by CVD (Chemical Vapor Deposition) to form insulation films 18 for insulating the floating gates and word lines (control gates) from each other. These insulation films 18 can be formed as a three-layered composite insulation film of, for example, SiO$_2$, SiN$_x$, and SiO$_2$. A second level polysilicon film is then formed over the substrate 10.

The second level polysilicon film is etched to obtain a predetermined pattern of the word lines. This etching continues to pattern the insulation films 18 and the first level polysilicon film. Thus, floating gates 20 formed of the first level polysilicon film, and word lines (control gates) $22_1$ to $22_3$ formed of the second level polysilicon film are obtained.

The word lines $22_1$ to $22_3$ cross the element forming regions 14 at right angles. Furthermore, drain forming regions D and source forming region S of the memory cell transistor are delimited on the substrate 10. The drain forming regions D are formed like an island between the word lines $22_1$ and $22_2$ and surrounded by the field oxide films 12. The source forming region S is formed like a strip between the word lines $22_2$ and $22_3$.

As shown in FIG. 1C to 3C, a resist film 24 is formed by photolithography so as to cover a portion between the word lines $22_1$ and $22_2$, i.e., a bit line connecting portion (drain) of a memory cell which is to be formed. The resist film 24 also covers a portion of the word line $22_3$, i.e., a bit line connecting portion of a memory cell which is to be formed. Next, the field oxide films 12 are removed from the source forming region by, e.g., RIE (Reactive Ion Etching), using the resist film 24 and word lines $22_1$ to $22_3$ as masks, thereby obtaining source line forming regions 26. The surface of the substrate 10 is exposed to the source line forming regions 26. A well-known etching method, which is easy to etch a silicon dioxide but difficult to etch silicon, can be applied to the step shown in FIGS. 1C to 3C.

In the SAS process described above, source lines are self-aligned with the word lines by patterning the word lines, and the width and forming position of each of the source lines are determined by the self-alignment.

As shown in FIGS. 1D to 3D, after the resist film 24 is removed, new resist is applied to form a resist film 28 by photolithography. The resist film 28 includes openings 30 which are positioned D1 or D2 away from the ends of the source line forming regions 26. The openings 30 are also positioned D3 or D4 away from the ends of the element forming regions 14. Using the resist film 28 as a mask, p-type impurities such as boron ions 32 for forming a channel stopper, are implanted into the substrate 10 through the openings 30. (In this specification, a diffusion layer having the same conductivity type as that of the substrate 10 formed under the field oxide films 12 is conventionally called a channel stopper. However, the channel stopper has the greater advantage of preventing a parasitic transistor whose word lines serve as a gate from conducting electricity than the advantage of preventing a punch through phenomenon from appearing between drain diffusion layers of a memory cell transistor.)

The above boron ions are implanted so that they penetrate the field oxide films 12 and a desired amount thereof reaches the substrate 10. In this step, the field oxide films 12 and the insulation films 18 for insulating the control gates $22_1$ to $22_3$ and the floating gates 20 from each other, have already been formed, and a high-temperature heating process is restricted after the boron ions 32 are implanted. Therefore, a so-called narrow channel effect in which the implanted boron ions are horizontally diffused into the channel regions to vary the characteristics of a transistor, can be eliminated since the impurities for forming a channel stopper are implanted after field oxidation and none of the boron ions are applied to the high-temperature heating process. Furthermore, in the first embodiment, crossing points of the word lines $22_1$ to $22_3$ and the element forming regions 14, i.e., a portion near the channel is covered with the resist film 28. In this respect, the narrow channel effect can be prevented more sufficiently.

It is desirable that a photo mask used in the step shown in FIGS. 1D to 3D be matched with the word lines $22_1$ to $22_3$. The reason is as follows. The distance D1 or D2 between the source forming region 26 and the opening 30 can be controlled with precision, and an N+-type source region and a P+-type channel stopper layer, which are to be formed in the next step, can exactly be prevented from contacting each other.

As shown in FIGS. 1E to 3E, after the resist film 28 is removed, arsenic or phosphorus of N-type impurities is ion-implanted into the substrate 10, using the word lines $22_1$ to $22_3$ and field oxide films 12 as masks. Thus, N+-type drain regions 34 and N+-type source regions 36 of memory cell transistors are formed in the element forming regions 14 and source line forming regions 26, respectively. Reference numeral 38 in FIGS. 1E to 3E denotes P+-type channel stopper layers.

After that, though not shown, an interlayer insulation film such as a silicon dioxide film is formed over the substrate 10, a contact hole communicating with the drain region 34 is formed in the interlayer insulation film, and bit lines of, e.g., aluminum, which are electrically connected to the drain region 34 through the contact hole, are formed so as to cross the word lines $22_1$ to $22_3$. Needless to say, a well-known technique as well as the above technique can be applied to the steps subsequent to the step shown in FIGS. 1E to 3E.

According to the manufacturing method of the first embodiment, as shown in FIGS. 1E to 3E in particular, since the P+-type channel stopper layers 38 can be separated from the N+-type source regions 36, they do not contact each other. It is thus possible to prevent a withstanding voltage of the N+-type source regions 36 against the P-type substrate 10 from deteriorating.

Furthermore, the narrow channel effect can be prevented by implanting boron for forming a channel stopper into the substrate 10 after the field oxide films 12 are formed and by not implanting the boron into a portion near the channel.

A first modification to the first embodiment will now be described.

FIG. 4 is a plan view showing the main step in the first modification to the above first embodiment of the present invention, FIG. 5 is a cross-sectional view taken along line 5—5 in FIG. 4, and FIG. 6 is a cross-sectional view taken along line 6—6 in FIG. 4.

In order to horizontally lengthen a region containing high-concentration boron which effectively serves as a channel stopper layer, beams of the boron ions 32 are implanted into the substrate 10 through the openings 30 at a predetermined angle with the perpendicular to the substrate 10, as shown in FIGS. 4 to 6. According to this method, the area of an implanting area can be made larger than that of the opening 30, and the area of the channel stopper layer can be increased laterally.

The method of the first modification has the advantage of increasing the boron concentration in an interface between the substrate 10 and the field oxide films 12 more easily than the method for simply expanding the openings 30 and implanting the beams of boron ions 32 through the openings at an angle of 90 degrees with the substrate 10. These methods will be described more specifically. In the method for implanting ions perpendicularly to the substrate 10, the expanded openings 30 reach birds' beaks. Since the oxide films of the birds' beaks are thin, if the ions are implanted perpendicular to the substrate 10, they easily penetrate the oxide film and arrive at deep portions of the substrate 10. However, in the method for implanting the beams of the ions at an angle with the substrate 10, the ions fly diagonally in the field oxide films 12. For this reason, the ions fly a long distance in the oxide film even in the birds' beaks, and can be concentrated on a portion near the interface between the substrate 10 and the field oxide films 12.

The first modification can be attained by the following methods. One of the methods is to implant boron ions into the substrate 10 diagonally in two different directions, and the other method is to implant boron ions diagonally in one direction and rotate the substrate 10 while fixing the implanting direction. It is desirable that an angle between the ion beams and the substrate 10 be set to 7 or more degrees when the element forming surface of the substrate 10 is (100).

The step shown in FIGS. 4 to 6 corresponds to the step shown in FIGS. 1D to 3D.

A second modification to the first embodiment of the present invention will be described.

Figure 7:
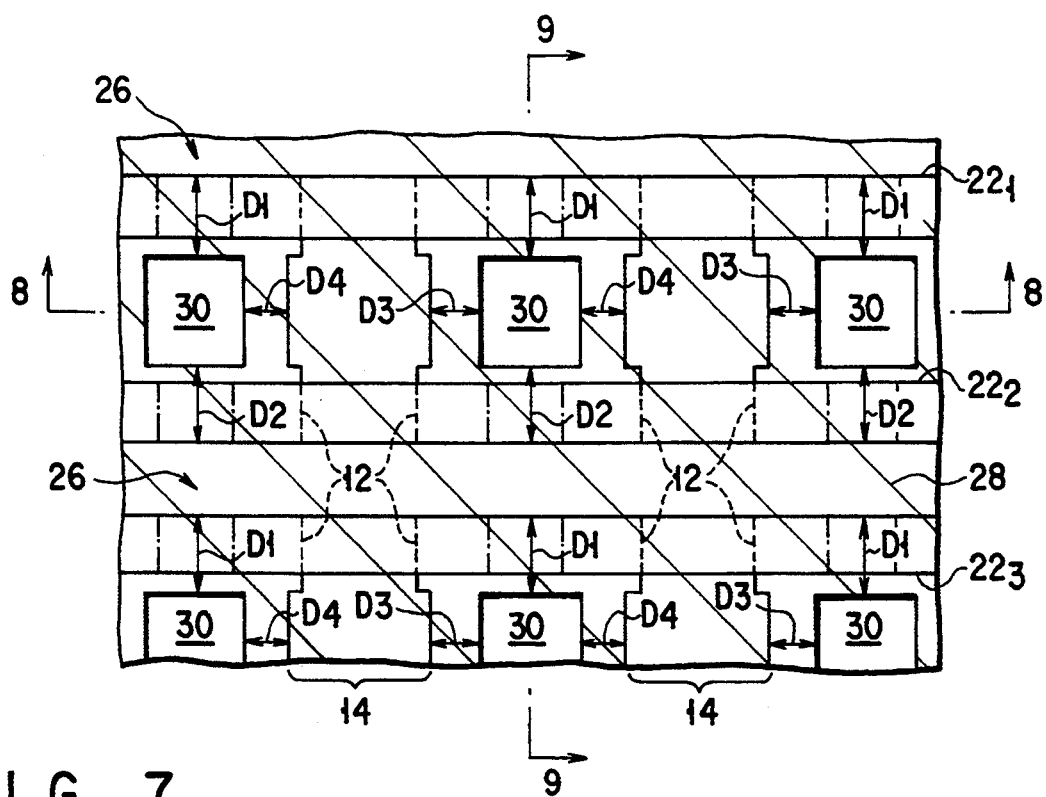
FIG. 7 is a plan view showing the main step of a second modification to the manufacturing method according to the first embodiment of the present invention.
Figure 8:
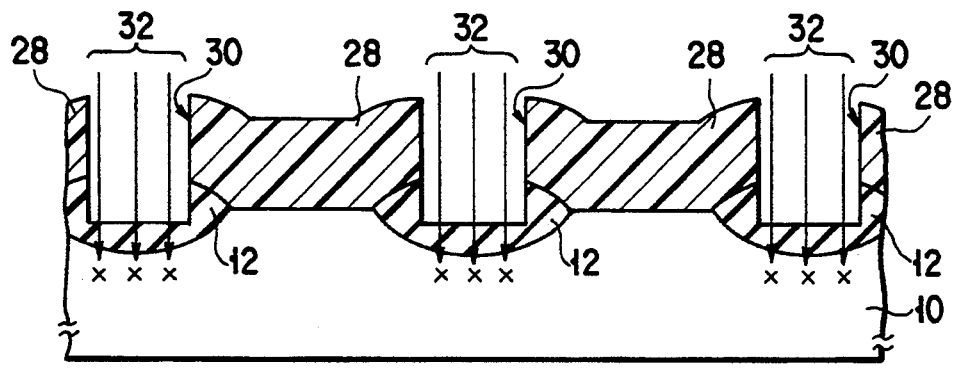
FIG. 8 is a cross-sectional view taken along line 8—8 of FIG. 7.
Figure 9:
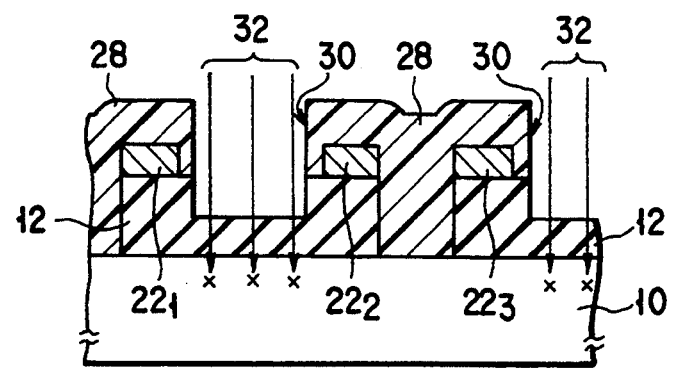
FIG. 9 is a cross-sectional view taken along line 9—9 of FIG. 7.

FIG. 7 is a plan view showing the main step of the second modification to the above first embodiment of the present invention, FIG. 8 is a cross-sectional view taken along line 8—8 in FIG. 7, and FIG. 9 is a cross-sectional view taken along line 9—9 in FIG. 7.

In order to implant ions through the field oxide film 12 having a large thickness, an expensive high-acceleration ion implantation device is required, the impurities are distributed widely in the depth direction, and the amount of the impurities is easily influenced by irregularity of the thickness of the field oxide film 12. Therefore, the field oxide film 12 is slightly etched to make its thickness smaller, as shown in FIGS. 7 to 9. Since the field oxide film 12 is thinned, the ions can be implanted into the substrate 10 formed under the field oxide film 12 without increasing an acceleration voltage of ion implantation too much. Further, the impurities are difficult to distribute widely in the depth direction by ion implantation at a low acceleration voltage rather than by ion implantation at a high acceleration voltage. Moreover, the influence of the amount of impurities upon the irregularity of the thickness of the field oxide film 12 can be reduced.

The second modification is attained by the following method. More specifically, the resist film 28 for forming a channel stopper is formed, and then the field oxide film 12 is etched using the resist film 28 as a mask, thereby decreasing the thickness of the field oxide film 12. After that, boron ions 32 for forming a channel stopper are implanted using the resist film 28 as a mask.

The step shown in FIGS. 7 to 9 corresponds to the step shown in FIGS. 1D to 3D. Needless to say, the second modification can be executed in combination with the first modification described above.

A method for manufacturing a semiconductor memory device according to the second embodiment of the present invention, will now be described.

Figure 10:
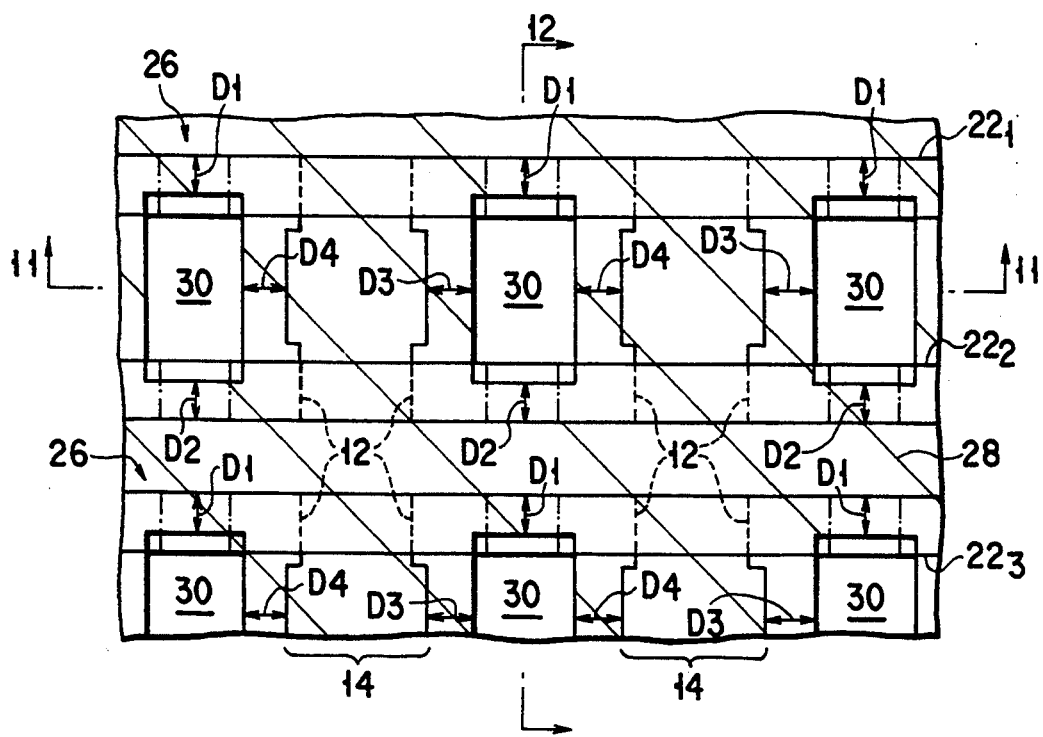
FIG. 10 is a plan view showing the main step in a method for manufacturing a semiconductor memory device according to a second embodiment of the present invention.
Figure 11:
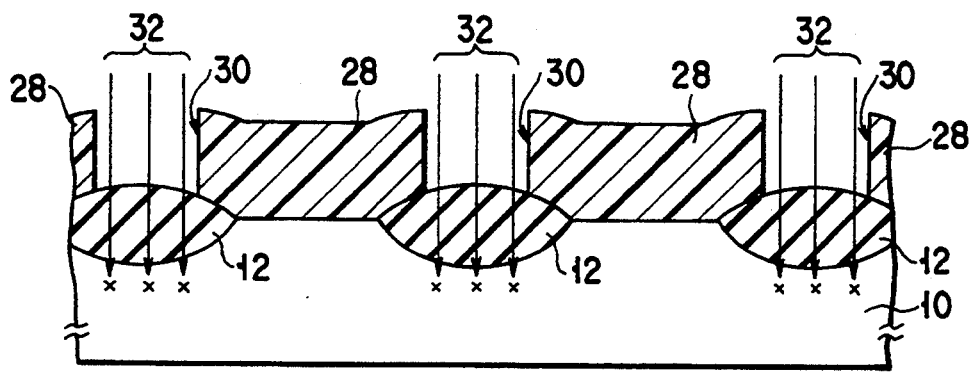
FIG. 11 is a cross-sectional view taken along line 11—11 of FIG. 10.
Figure 12:
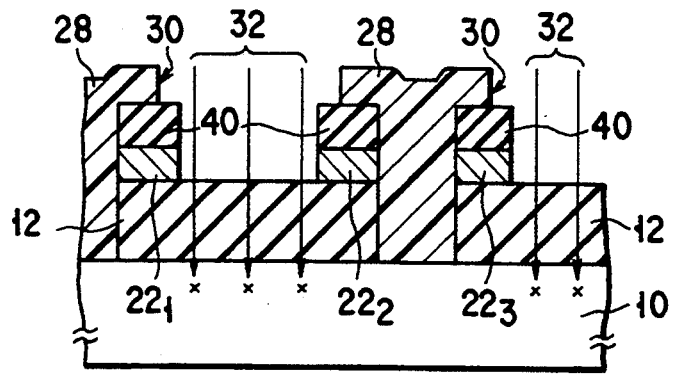
FIG. 12 is a cross-sectional view taken along line 12—12 of FIG. 10.

FIG. 10 is a plan view showing the main step of the method according to the second embodiment, FIG. 11 is a cross-sectional view taken along line 11—11 in FIG. 10, and FIG. 12 is a cross-sectional view taken along line 12—12 in FIG. 10.

As shown in FIGS. 10 to 12, the openings 30 through which impurities for forming P+-type channel stopper layers 38 pass, can overlap the word lines $22_1$ to $22_3$.

Since a thick gate electrode layer (e.g., polysilicon layer) is formed on the word lines $22_1$ to $22_3$, the boron ions 32 are hard to reach the substrate 10. For this reason, if a condition such as low acceleration voltage is met, the word lines $22_1$ to $22_3$ are used as masks, and the channel stopper layer and the source region do not contact each other. In FIGS. 10 to 12, the openings 30 are D1 or D2 away from the source forming regions 26 in order to prevent the openings 30 from overhanging the source line forming regions 26 even though a mask displacement occurs.

As shown in FIG. 12, silicon oxide films ($SiO_2$) 40 are formed on the word lines $22_1$ to $22_3$ so that they are self-aligned with each other. Though the silicon oxide films 40 need not always be formed, a masking effect of the boron ions 32 for forming the channel stopper layer can be enhanced.

The step shown in FIGS. 10 to 12 corresponds to the step shown in FIGS. 1D to 3D. The second embodiment can also be executed in combination with the first modification shown in FIGS. 4 to 6 or the second modification shown in FIGS. 7 to 9.

A method for manufacturing a semiconductor memory device according to the third embodiment of the present invention will now be described.

Figure 13A:
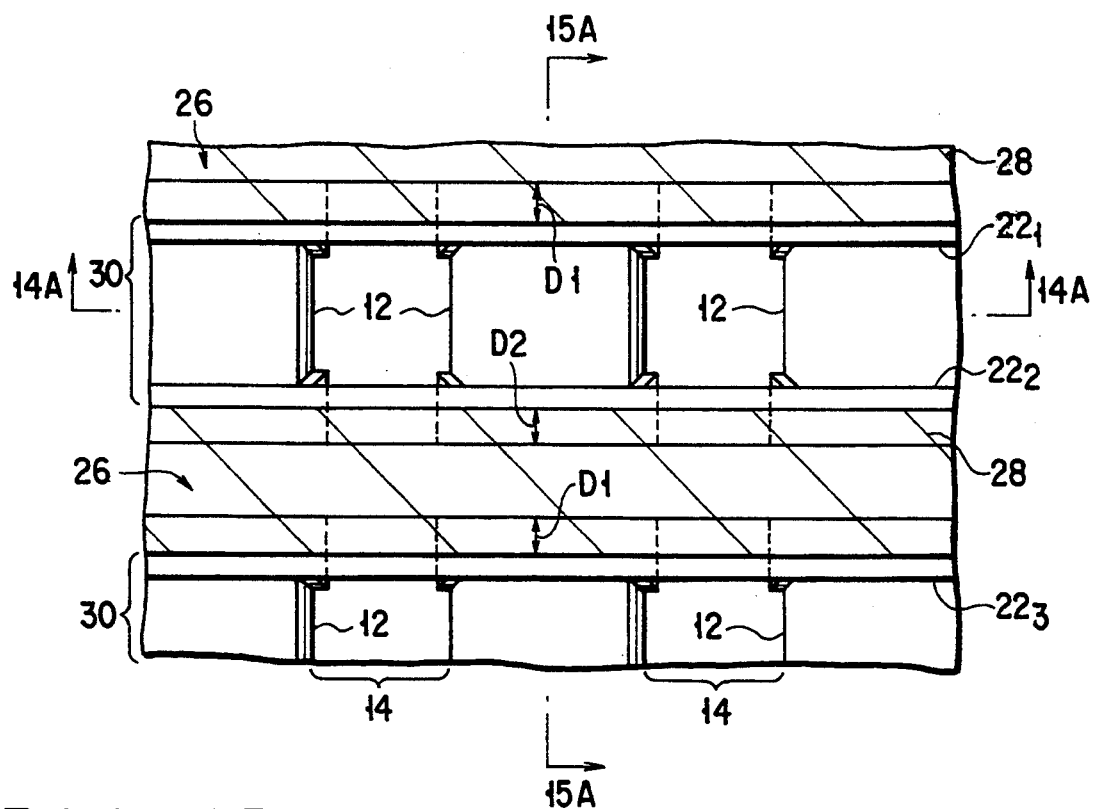
Figure 14A:
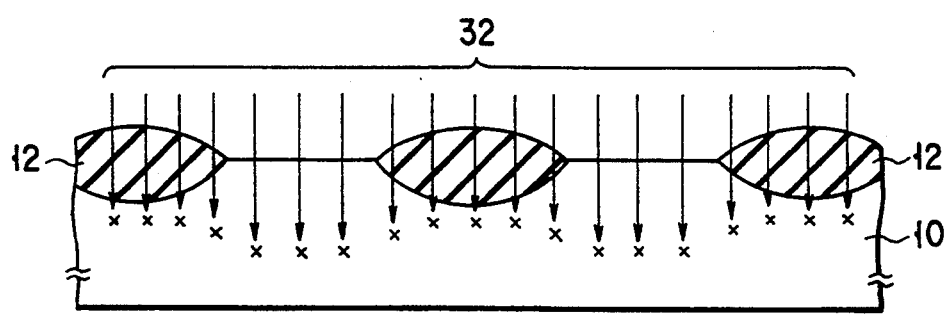
Figure 15A:
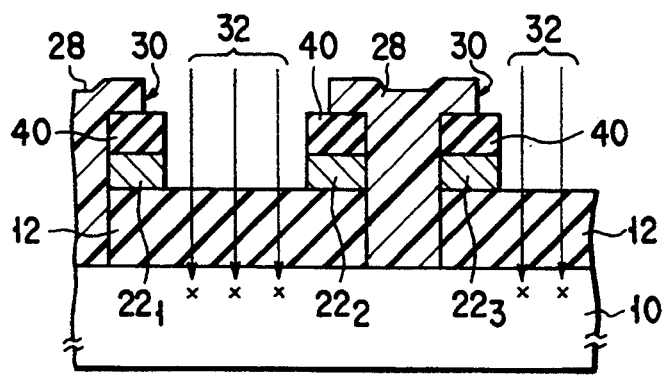
Figure 19A:
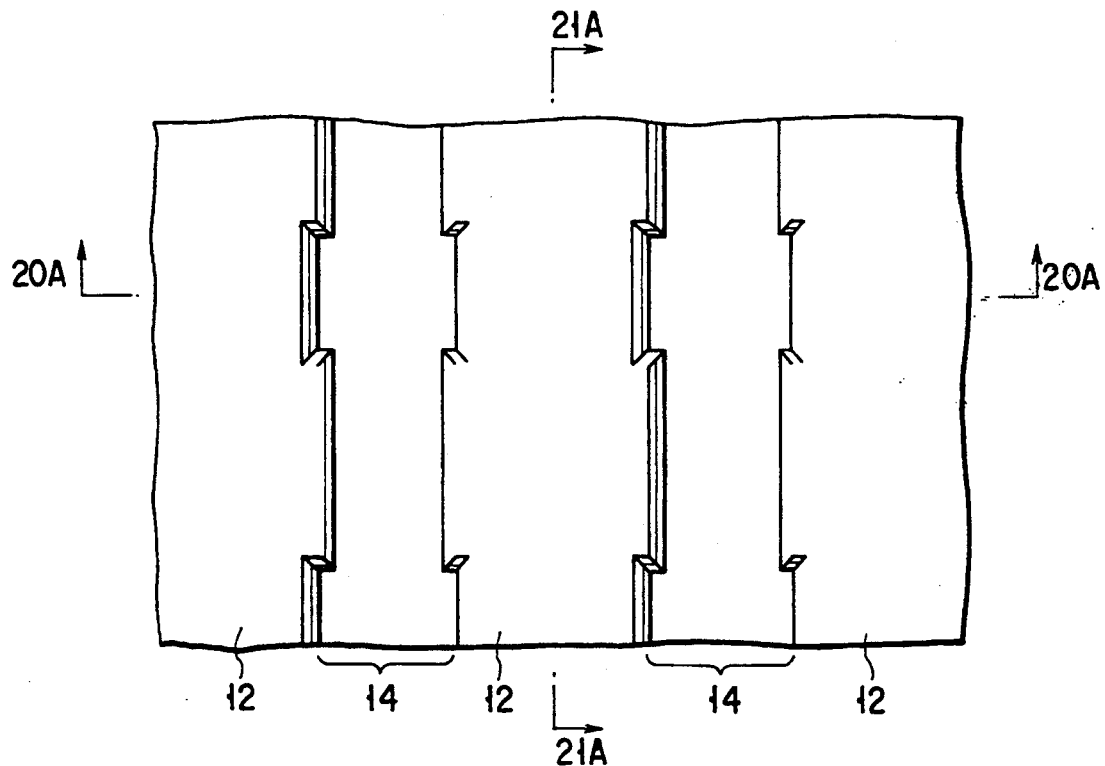
Figure 20A:
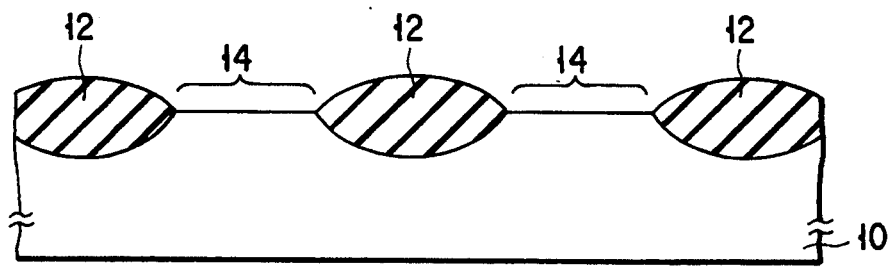
Figure 21A:
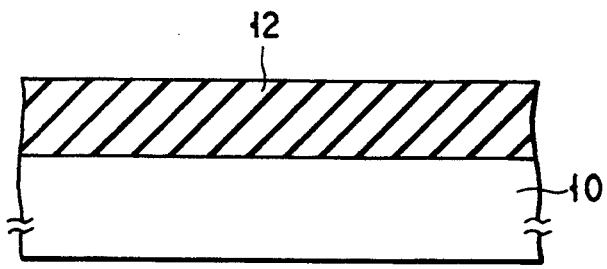
Figure 19C:
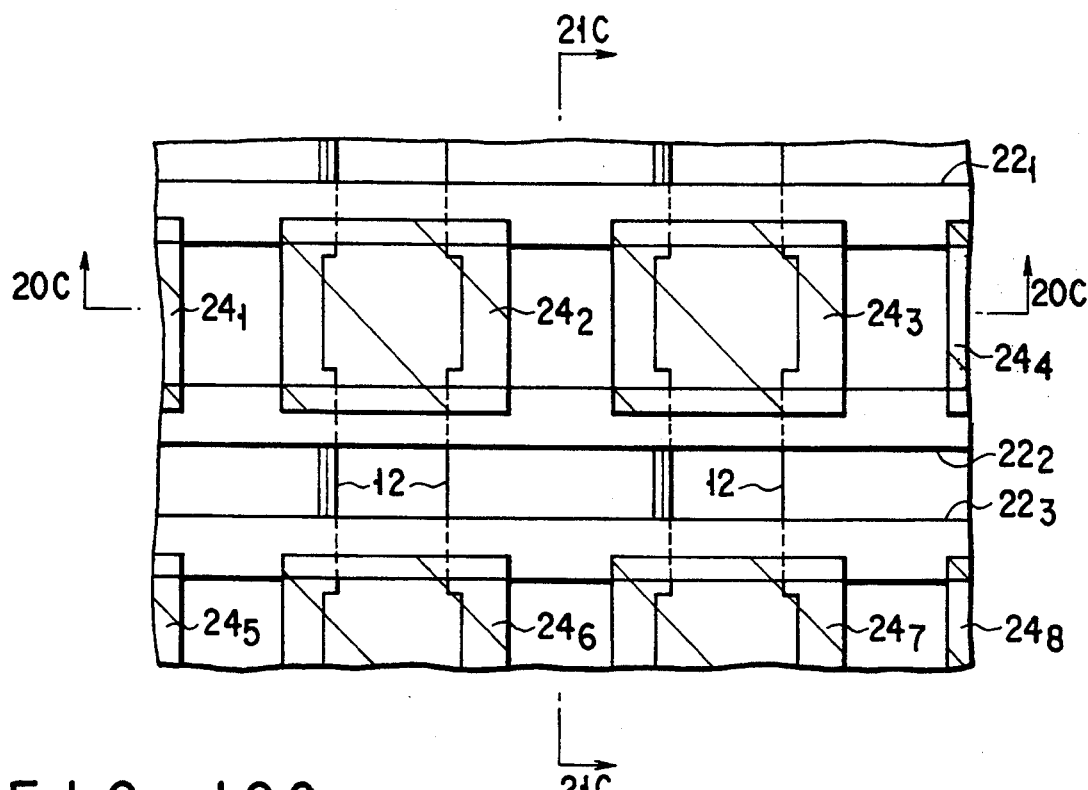
Figure 20C:
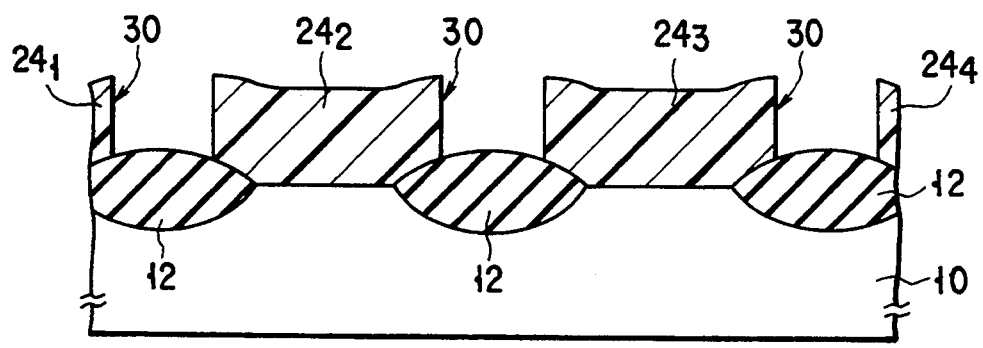
Figure 21C:
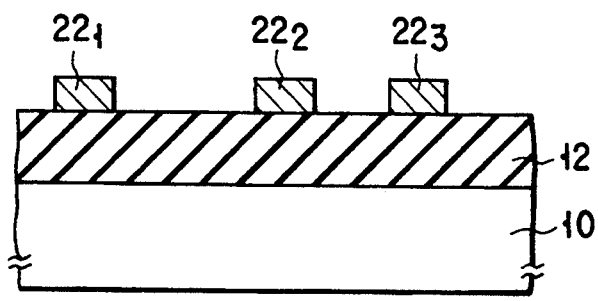
Figure 19D:
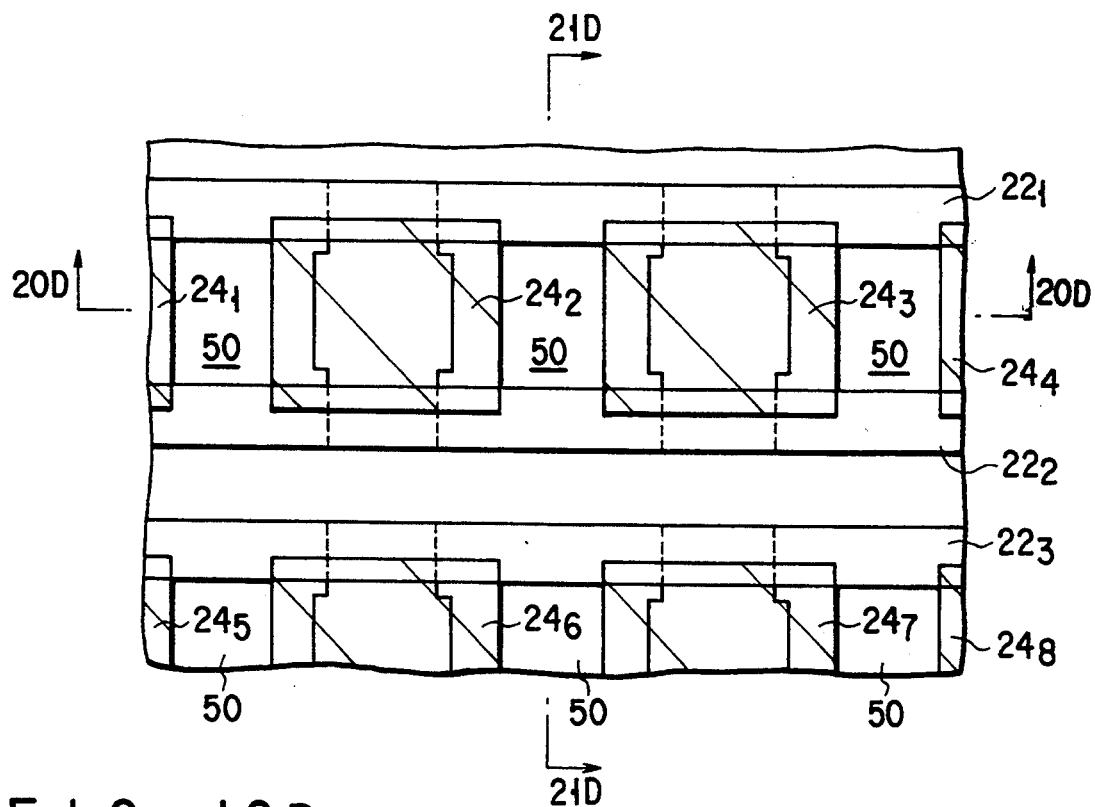
Figure 20D:
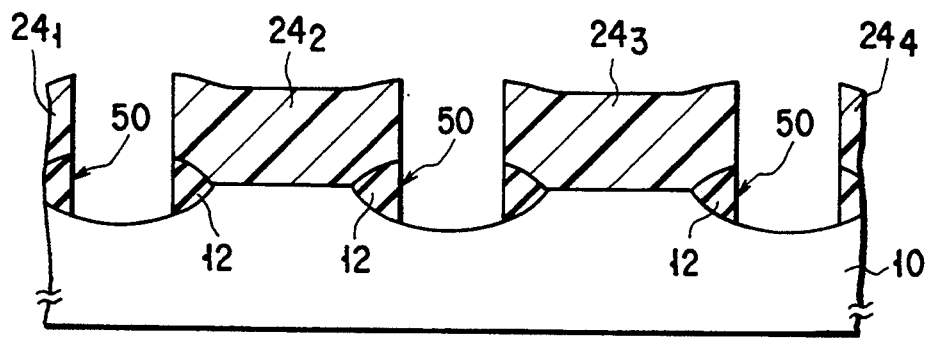
Figure 21D:
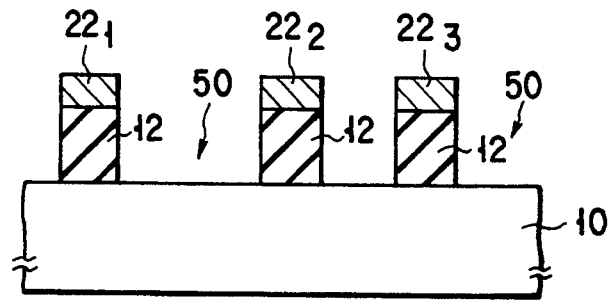
Figure 19E:
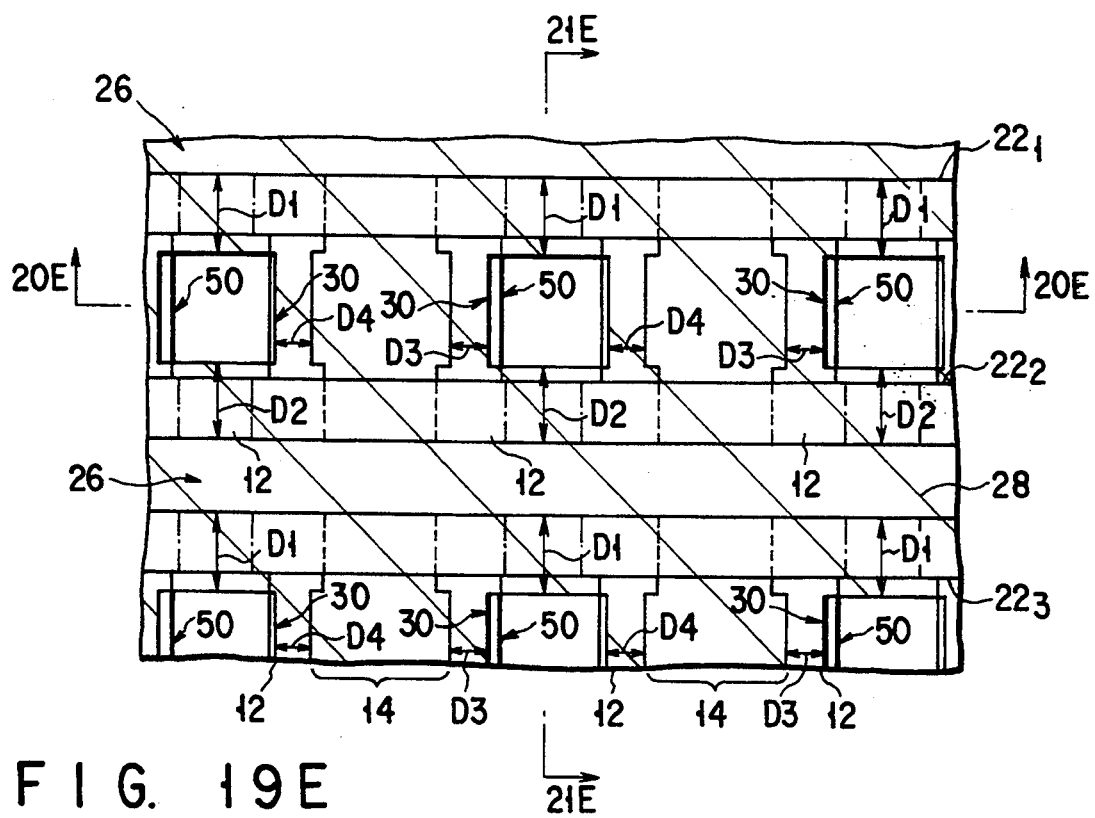
Figure 20E:
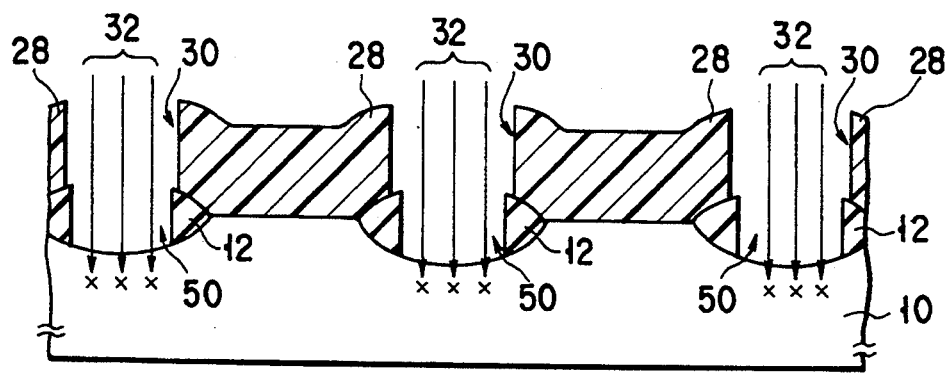
Figure 21E:
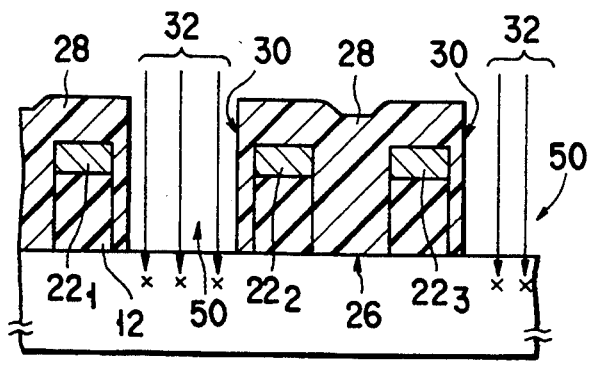
Figure 19F:
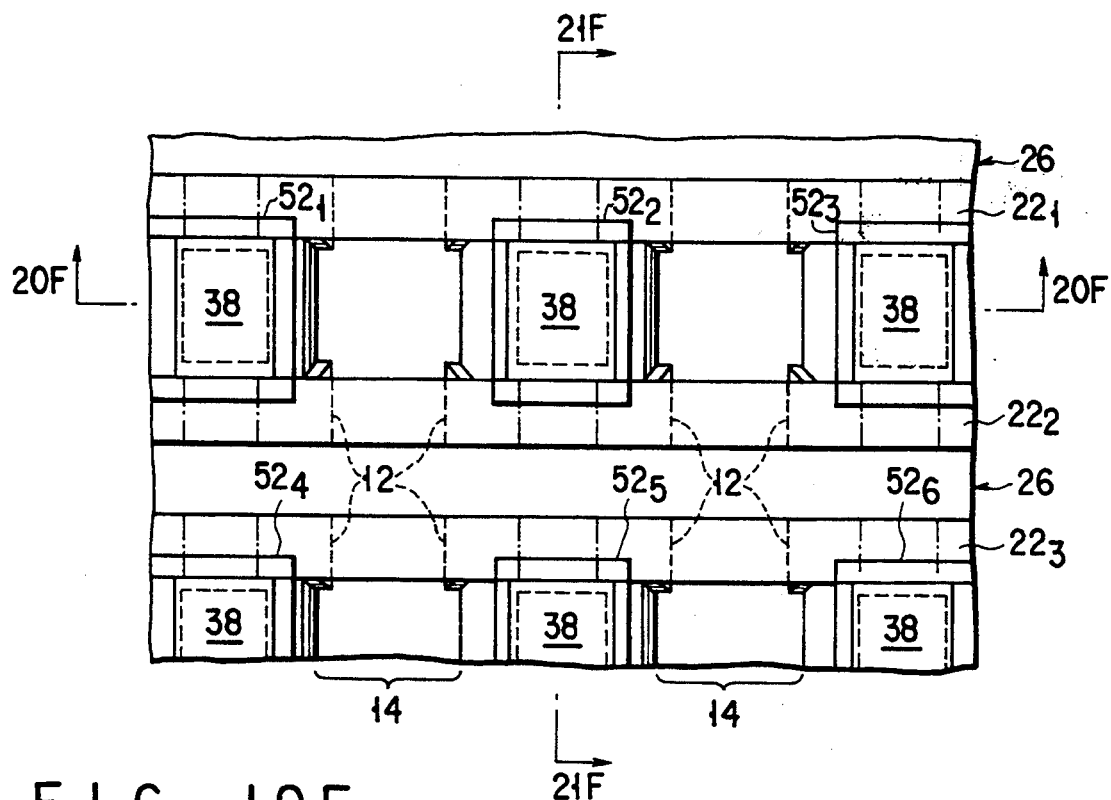
Figure 20F:
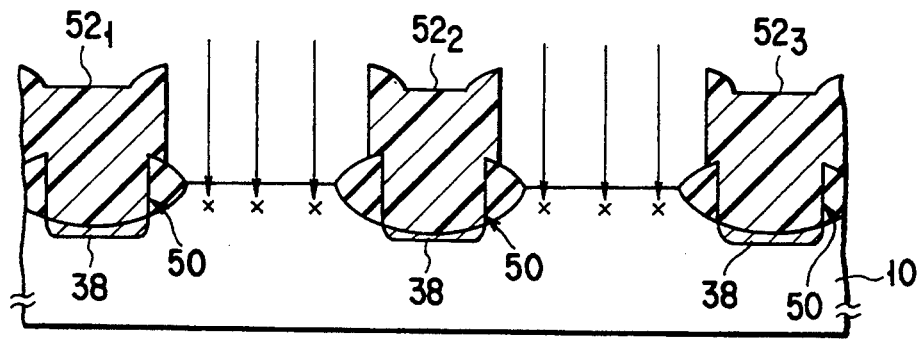
Figure 21F:
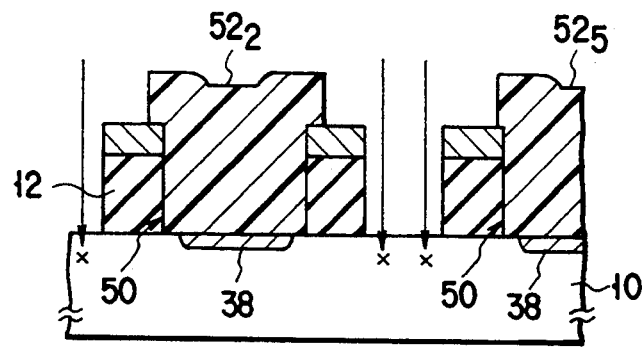

FIGS. 13A and 13B are plan views showing the main step of the manufacturing method according to the third embodiment, FIGS. 14A and 14B are cross-sectional views taken along line 14A—14A in FIG. 13A and line 14B—14B in FIG. 13B, respectively, and FIGS. 15A and 15B are cross-sectional views taken along line 15A—15A in FIG. 13A and line 15B—15B in FIG. 13B, respectively.

As shown in FIGS. 13A to 15A, the resist films 28 can be formed so as to cover only the source forming regions 26. As shown in FIG. 14A, the boron ions 32 are implanted into the substrate 10 through the openings 30 to which the field oxide films 12 and the element forming regions 14 are exposed. The acceleration voltage is set so that the concentration of the boron ions can be increased as much as possible in the interface between the substrate 10 and the field oxide film 12. As shown in FIG. 15A, the silicon oxide films 40 are formed on the word lines $22_1$ to $22_3$. As in the second embodiment, the silicon oxide films 40 need not always be formed. In FIG. 13A, the openings are D1 or D2 away from the source forming regions 26 in order to prevent the openings 30 from overhanging the source forming regions 26 even though a mask displacement occurs.

As shown in FIGS. 13B to 15B, after the resist film 28 is removed, arsenic or phosphorus of N-type impurities is implanted into the substrate 10, using the word lines $22_1$ to $22_3$ and the field oxide films 12 as masks, by the same method as that described above with reference to FIGS. 1E to 3E. Thus, the N+-type drain and source regions 34 and 36 of the memory cell transistor are formed in the element forming region 14 and the source line forming region 26, respectively. The boron implanted into the substrate 10 under the element forming regions 14 and field oxide films 12 in the step shown in FIGS. 13A to 15A, is activated as a P-type diffusion layer 42. This P-type diffusion layer 42 can be used as a so-called P-pocket layer for preventing a punch through phenomenon between the source and drain regions.

A modification to the third embodiment will now be described.

FIG. 16 is a plan view showing the main step of the modification to the method for manufacturing a semiconductor memory device according to the third embodiment of the present invention, FIG. 17 is a cross-sectional view taken along line 17—17 in FIG. 16, and FIG. 18 is a cross-sectional view taken along line 18—18 in FIG. 16.

As shown in FIGS. 16 to 18, boron ions 32 are implanted into the substrate 10 at a relatively low acceleration voltage, in parallel with the word lines $22_1$ to $22_3$, at a predetermined angle with the substrate 10, and using the resist films 28 as masks. According to this method, the boron ions 32 are implanted into the substrate 10 formed under the field oxide film 12, as shown in FIG. 17. It is therefore possible to concentrate the boron on the interface between the substrate 10 and thin regions of the field oxide films 12, for example, the interface the substrate 10 and regions under the birds' beaks. If the boron is concentrated on the interface, an inversion prevention effect is improved directly under the thin regions of the field oxide films and thus a punch through effect between the drain regions 34 can be suppressed.

The modification to the third embodiment is achieved by the following two methods. One of the methods is to implant the boron ions into the substrate 10 in two different directions and in parallel with the word lines $22_1$ to $22_3$. The other method is to implant the boron ions into the substrate 10 diagonally in one direction, rotate it 180°, and implant them again in the same direction. It is desirable that the angle of a beam of the boron ions is 7 degrees or more when the element forming region of the silicon substrate 10 is (100).

The modification to the third embodiment can be executed after the step shown in FIGS. 13A to 15A in combination with the third embodiment. It can be also executed before the step shown in FIGS. 13A to 15A. The reason is as follows. In this modification, the boron ions have to be implanted at a low acceleration voltage since they enter the substrate 10 formed under the thin regions of the field oxide films 12. Therefore, no boron ions may be implanted into the substrate formed under the thick regions of the field oxide films 12, and the step shown in FIGS. 13A to 15A is added in order to compensate for this drawback. For example, the boron ions are implanted in a direction perpendicular to the substrate 10 at such a high acceleration voltage as to enable them to penetrate the field oxide films 12.

As shown in FIG. 18, silicon oxide films 40 are formed on the word lines $22_1$ to $22_3$. The silicon oxide films not only improves the masking effect but also has the following advantage in the third embodiment in which the channel region is exposed from the opening 30. If the boron ions 32 are diagonally implanted into the substrate 10 or implanted at a high acceleration voltage, useless boron ions 32 may enter the channel region. Therefore, the silicon oxide films 40 are formed on the word lines $22_1$ to $22_3$, and the openings 30 are formed more deeply. A shadow effect, which is a problem in the ion implantation, is favorably obtained to prevent useless boron ions from being implanted into the channel region.

It is desirable to apply the first and second embodiments in which the drain region 34 and channel stopper 38 do not contact each other, rather than the third embodiment, to a device requiring a very high withstanding voltage between the drain region 34 and the substrate 10. It is desirable to apply the third embodiment of simple photolithography to a device not requiring a high withstanding voltage between the drain region 34 and the substrate 10.

A method for manufacturing a semiconductor memory device according to the fourth embodiment of the present invention will now be described.

FIGS. 19A to 19G are plan views showing steps in a method for manufacturing a semiconductor memory device according to the fourth embodiment of the present invention, FIGS. 20A to 20G are cross-sectional views taken along lines 20A—20A to 20G—20G in FIGS. 19A to 19G, respectively, and FIGS. 21A to 21G are cross-sectional views taken along lines 21A—21A to 21G—21G in FIGS. 19A to 19G, respectively.

The fourth embodiment corresponds to the second modification to the first embodiment wherein the impurities for forming a channel stopper are implanted into the substrate 10 after the thickness of the field oxide film 12 is reduced.

As shown in FIGS. 19A to 21A, field oxide films 12 are formed in a striped fashion on the substrate 10 to obtain striped element forming regions 14, by the method shown in FIGS. 1A to 3A.

As shown in FIGS. 19B to 21B, at least three first to third word lines are formed in parallel to one another so as to cross the element forming regions 14 a right angles, by the same method as that of the step shown in FIGS. 1B to 3B. Therefore, the drain forming regions D are formed like an island between the word lines $22_1$ and $22_2$ and surrounded by the field oxide films 12. The source forming region S is formed like a strip between the word lines $22_2$ and $22_3$.

A plurality of resist films $24_1$ to $24_8$ used in the SAS process, are formed, as shown in FIGS. 19C to 21C. These resist films $24_1$ to $24_8$ are formed to cover the drain forming regions and their neighboring portions of the element forming regions 14.

As shown in FIGS. 19D to 21D, the field oxide films 12 are removed, using the resist films $24_1$ to $24_8$ as masks, by the method of the step shown in FIGS. 1C to 3C. Thus, as shown in FIG. 20D, the field oxide films 12 are removed from the source forming regions and from the regions into which the impurities for forming a channel stopper are implanted, thereby forming openings 50 so as to expose the surface of the substrate 10 from the bottoms of the openings 50.

As shown in FIGS. 19E to 21E, the resist films 24 are removed to form resist films 28 each having an opening 30, by the method of the step shown in FIGS. 1D to 3D. Using the resist films 28 as masks, P-type impurities for forming a channel stopper, for example, boron ions 32 are implanted into the substrate 10 through the openings 30 and 50.

As shown in FIGS. 19F to 21F, after the resist film 28 is removed, after the resist film 24 is removed, new resist is applied to form resist films $52_1$ to $52_6$ by photolithography. These resist films cover the openings 50. Then, arsenic or phosphorus of N-type impurities is ion-implanted into the substrate 10, using the word lines $22_1$ to $22_3$, field oxide films 12, and resist films $52_1$ to $52_6$ as masks. As shown in FIGS. 19G to 21G, therefore, N+-type drain and source regions 34 and 36 of memory cell transistors in the element forming regions 14 and source line forming regions 26, respectively. Reference numeral 38 in FIGS. 19G to 21G indicates P+-type channel stopper layers.

According to the fourth embodiment, the field oxide films 12 on the source line forming regions 26 and the field oxide films 12 on the channel stopper layer forming regions can be removed at once by a single etching process. A structure having the advantage of the modifications to the first embodiment can thus be obtained, without increasing the number of manufacturing steps.

The fourth embodiment can be executed in combination with the modifications to the first embodiment, the second and third embodiments, and the modification to the third embodiment.

In the first to fourth embodiments, an element separating region is formed by thermal oxidation before the word lines are formed. However, these embodiments can be applied when the element separating region is separated only by ion implantation and, in this case, steps for forming and eliminating the element separating region (field oxide film) are not required, and impurities having the same conductivity type as that of the substrate are ion-implanted while covering the source region after the word lines are formed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a semiconductor memory device, comprising the steps of:
   forming a plurality of striped element separating regions in a surface region of a semiconductor substrate to obtain a plurality of striped element forming regions on the semiconductor substrate;
   forming at least first, second and third word lines so as to cross the element forming regions at right angles, delimiting a drain forming region formed between the first and second word lines and surrounded by the element s forming region between the second and third word lines;
   forming a first cover layer on a region between the first and second word lines;
   removing the element separating regions from the source forming region, using the first cover layer and the first, second and third word lines as masks;
   forming a second cover layer at least on the source forming region; and
   introducing impurities whose conductivity type is equal to a conductivity type of the semiconductor substrate, into the semiconductor substrate, using the second cover layer as a mask.

2. The method according to claim 1, wherein the second cover layer is formed entirely on a main surface of the semiconductor substrate and has windows corresponding to the element separating regions between the first and second word lines.

3. The method according to claim 2, wherein the windows are separated from the first, second, and third word lines.

4. The method according to claim 2, wherein the windows overlap the first, second, and third word lines.

5. The method according to claim 2, wherein the impurities whose conductivity type is equal to the conductivity type of the semiconductor substrate are introduced into the semiconductor substrate through the element separating regions using an ion implantation technique.

6. The method according to claim 5, wherein said introducing step includes ion-implanting the impurities diagonally to the main surface of the semiconductor substrate.

7. The method according to claim 6, wherein said introducing step includes ion-implanting the impurities diagonally to the main surface of the semiconductor substrate while the substrate is rotated.

8. The method according to claim 1, further comprising the step of etching the element separating regions using the second cover layer as a mask.

9. The method according to claim 1, further comprising the step of forming films for preventing the impurities from being introduced, on the first, second, and third word lines.

10. The method according to claim 1, wherein the impurities whose conductivity type is equal to the conductivity type of the semiconductor substrate are introduced to increase insulation properties of the surface region of the semiconductor substrate under the element separating regions.

11. A method for manufacturing a semiconductor memory device, comprising the steps of:
    forming a plurality of striped element separating regions in a surface region of a semiconductor substrate to obtain a plurality of striped element trimming regions on the semiconductor substrate;
    forming at least first, second and third word lines so as to cross the element forming regions at right angles, delimiting a drain forming region formed between the first and second word lines and surrounded by the element separating regions, and delimiting a source forming region between the second and third word lines;
    forming a first cover layer on the drain forming region;
    removing the element separating regions, using the first cover layer, and the first, second and third word lines as masks;
    forming a second cover layer at least on the source forming region; and
    introducing impurities whose conductivity type is equal to a conductivity type of the semiconductor substrate, into the semiconductor substrate, using the second cover layer as a mask.

12. The method according to claim 11, wherein the second cover layer is formed entirely on a main surface of the semiconductor substrate and has windows corresponding to the element separating regions between the first and second word lines.

13. The method according to claim 12, wherein the windows are separated from the first, second, and third word lines.

14. The method according to claim 12, wherein the windows overlap the first, second, and third word lines.

15. The method according to claim 12, wherein the impurities whose conductivity type is equal to the conductivity type of the semiconductor substrate are introduced into the semiconductor substrate through the element separating regions using an ion implantation technique.

16. The method according to claim 15, wherein said introducing step includes ion-implanting the impurities diagonally to the main surface of the semiconductor substrate.

17. The method according to claim 16, wherein said introducing step includes ion-implanting the impurities diagonally to the main surface of the semiconductor substrate while the substrate is rotated.

18. The method according to claim 11, further comprising the step of etching the element separating regions using the second cover layer as a mask.

19. The method according to claim 11, further comprising the step of forming films for preventing the impurities from being introduced, on the first, second, and third word lines.

20. The method according to claim 11, wherein the impurities whose conductivity type is equal to the conductivity type of the semiconductor substrate are introduced to increase insulation properties of the surface region of the semiconductor substrate under the element separating regions.

* * * * *